United States Patent
Nagaura

(10) Patent No.: US 10,201,092 B2
(45) Date of Patent: Feb. 5, 2019

(54) CARRIER-ATTACHED COPPER FOIL, LAMINATE, PRINTED-WIRING BOARD AND METHOD FOR MANUFACTURING THE PRINTED WIRING BOARD

(71) Applicant: JX Nippon Mining & Metals Corporation, Tokyo (JP)

(72) Inventor: Tomota Nagaura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/039,464

(22) PCT Filed: Nov. 27, 2014

(86) PCT No.: PCT/JP2014/081468
§ 371 (c)(1),
(2) Date: May 26, 2016

(87) PCT Pub. No.: WO2015/080227
PCT Pub. Date: Jun. 4, 2015

(65) Prior Publication Data
US 2016/0353581 A1    Dec. 1, 2016

(30) Foreign Application Priority Data

Nov. 27, 2013   (JP) ................... 2013-244778
Apr. 15, 2014   (JP) ................... 2014-083892

(51) Int. Cl.
*C25D 5/48*    (2006.01)
*H05K 3/20*    (2006.01)
(Continued)

(52) U.S. Cl.
CPC ............. *H05K 3/205* (2013.01); *B32B 15/01* (2013.01); *B32B 15/20* (2013.01); *C25D 1/04* (2013.01);
(Continued)

(58) Field of Classification Search
CPC .......... H05K 3/025; H05K 3/205; C25D 5/48; B32B 15/01; B32B 2457/08; B32B 2307/538
See application file for complete search history.

(56) References Cited

U.S. PATENT DOCUMENTS 4,287,266 A * 9/1981 Myles .................... F24J 2/4652
                                                                      428/344
2003/0102227 A1* 6/2003 Billi ....................... C25D 11/34
                                                                      205/333
(Continued)

FOREIGN PATENT DOCUMENTS

EP    1139704 A1 * 10/2001 ........... H05K 3/0038
JP    8-279672 A    10/1996
(Continued)

OTHER PUBLICATIONS

Jafari, S, Rozati, SM, "Characterization of Black Chrome Films Prepared by Electroplating Technique." Solar Therm. Appl., 3999-4005 (2011).*

(Continued)

*Primary Examiner* — Livius Radu Cazan
(74) *Attorney, Agent, or Firm* — Nields, Lemack & Frame, LLC

(57) ABSTRACT

A carrier-attached copper foil having satisfactory circuit formability on the ultra-thin copper layer surface is provided. The carrier-attached copper foil has a carrier, an intermediate layer and an ultra-thin copper layer in this order. The ultra-thin copper layer surface has an absorbance of light at a wavelength of 400 nm is 85% or more.

21 Claims, 8 Drawing Sheets

(51) Int. Cl.
| | |
|---|---|
| *B32B 15/01* | (2006.01) |
| *C25D 1/04* | (2006.01) |
| *C25D 7/06* | (2006.01) |
| *B32B 15/20* | (2006.01) |
| *C25D 5/14* | (2006.01) |
| *C25D 3/40* | (2006.01) |
| *H05K 1/09* | (2006.01) |
| *H05K 3/00* | (2006.01) |
| *H05K 3/02* | (2006.01) |
| *H05K 3/40* | (2006.01) |
| *C25D 3/16* | (2006.01) |
| *C25D 3/38* | (2006.01) |
| *C25D 3/58* | (2006.01) |
| *C25D 9/08* | (2006.01) |
| *C25D 5/04* | (2006.01) |

(52) U.S. Cl.
CPC .............. *C25D 3/40* (2013.01); *C25D 5/14* (2013.01); *C25D 5/48* (2013.01); *C25D 7/0614* (2013.01); *H05K 1/09* (2013.01); *H05K 3/007* (2013.01); *H05K 3/027* (2013.01); *H05K 3/4038* (2013.01); *B32B 2307/306* (2013.01); *B32B 2307/538* (2013.01); *B32B 2457/08* (2013.01); *C25D 3/16* (2013.01); *C25D 3/38* (2013.01); *C25D 3/58* (2013.01); *C25D 5/04* (2013.01); *C25D 9/08* (2013.01); *H05K 2201/0338* (2013.01); *H05K 2201/0355* (2013.01)

(56) References Cited

U.S. PATENT DOCUMENTS

| | | | |
|---|---|---|---|
| 2004/0170857 A1* | 9/2004 | Yoshihara | C25D 5/10 428/553 |
| 2004/0231141 A1 | 11/2004 | Nishinaka et al. | |
| 2013/0048976 A1* | 2/2013 | Matsuura | H01L 51/441 257/40 |
| 2013/0220679 A1 | 8/2013 | Kawakami | |
| 2014/0141274 A1* | 5/2014 | Tzou | H05K 1/09 428/601 |

FOREIGN PATENT DOCUMENTS

| | | |
|---|---|---|
| JP | 2002-76578 A | 3/2002 |
| JP | 2005-288856 A | 10/2005 |
| JP | 2006-022406 A | 1/2006 |
| JP | 2008-211156 A | 9/2008 |
| JP | 2013-503965 A | 2/2013 |
| JP | 2013-239677 A | 11/2013 |
| KR | 2003-0027117 A | 4/2003 |
| WO | 2011/028004 A2 | 3/2011 |
| WO | 2012/046804 A1 | 4/2012 |
| WO | 2013/108414 A1 | 7/2013 |

OTHER PUBLICATIONS

McDonald, G.E. (1974) Refinement in black chrome for use as a solar selective coating, NASA Report TM X-3136, Lewis Res. Ctr. Cleveland, Ohio.*

Fukutomi et al, "Special Articles: Recent Trends on MCM and Bare LSI Chip Mounting. Manufacturing Process of PWBs for the Substrate of MCM and Bare Chip Mounting. Transfer Lamination Method", Circuit Technology, Aug. 1994, vol. 9, No. 5, pp. 369-376, and partial English translation pp. 371-372.

Japanese communication, with English translation, dated Sep. 15, 2015 in corresponding Japanese patent application No. 2014-083892.

International Search Report dated Feb. 24, 2015 in corresponding PCT application No. PCT/JP2014/081468.

International Preliminary Report on Patentability dated May 31, 2016 in corresponding PCT application No. PCT/JP2014/081468.

* cited by examiner

[Figure 1]
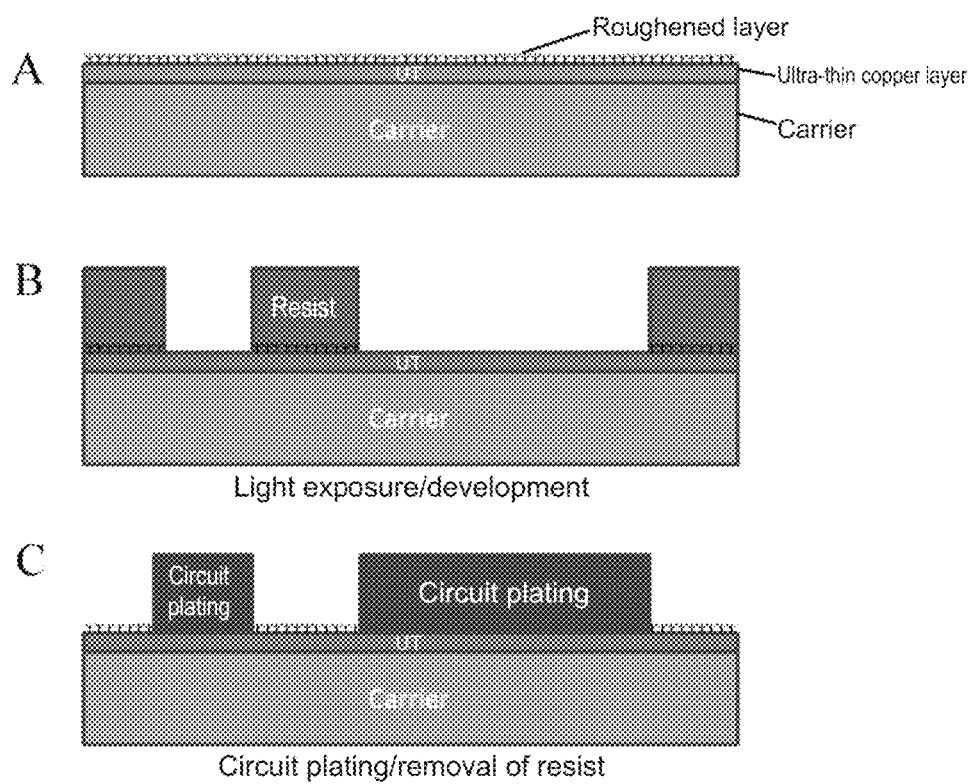

[Figure 2]
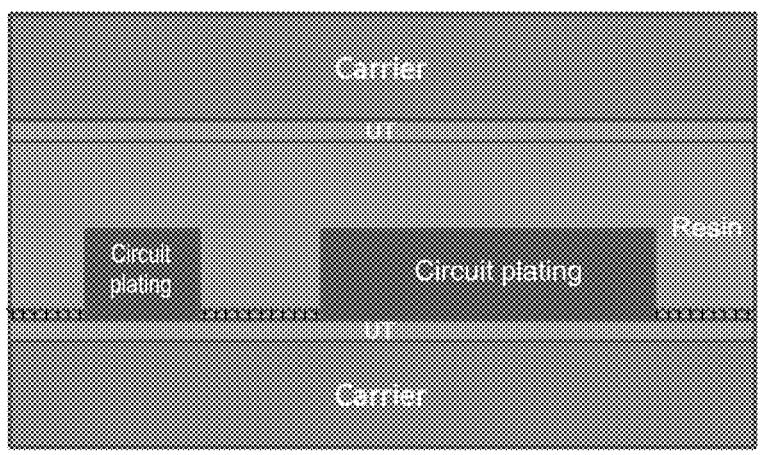
D
Lamination of resin and carrier-attached copper foil
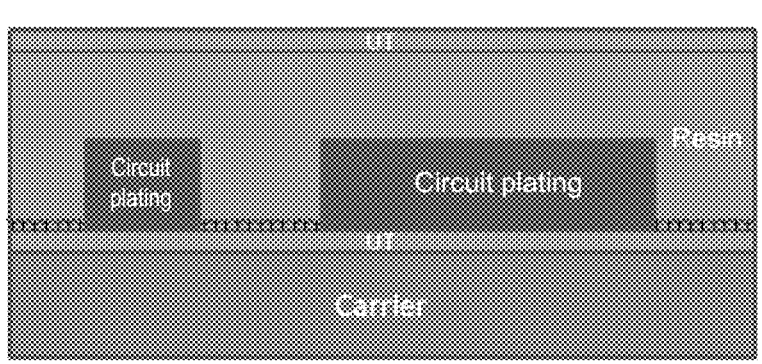
E
Release of the second carrier foil
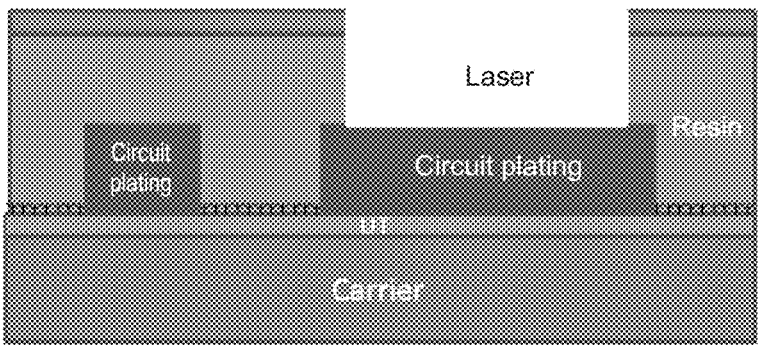
F
Laser drilling

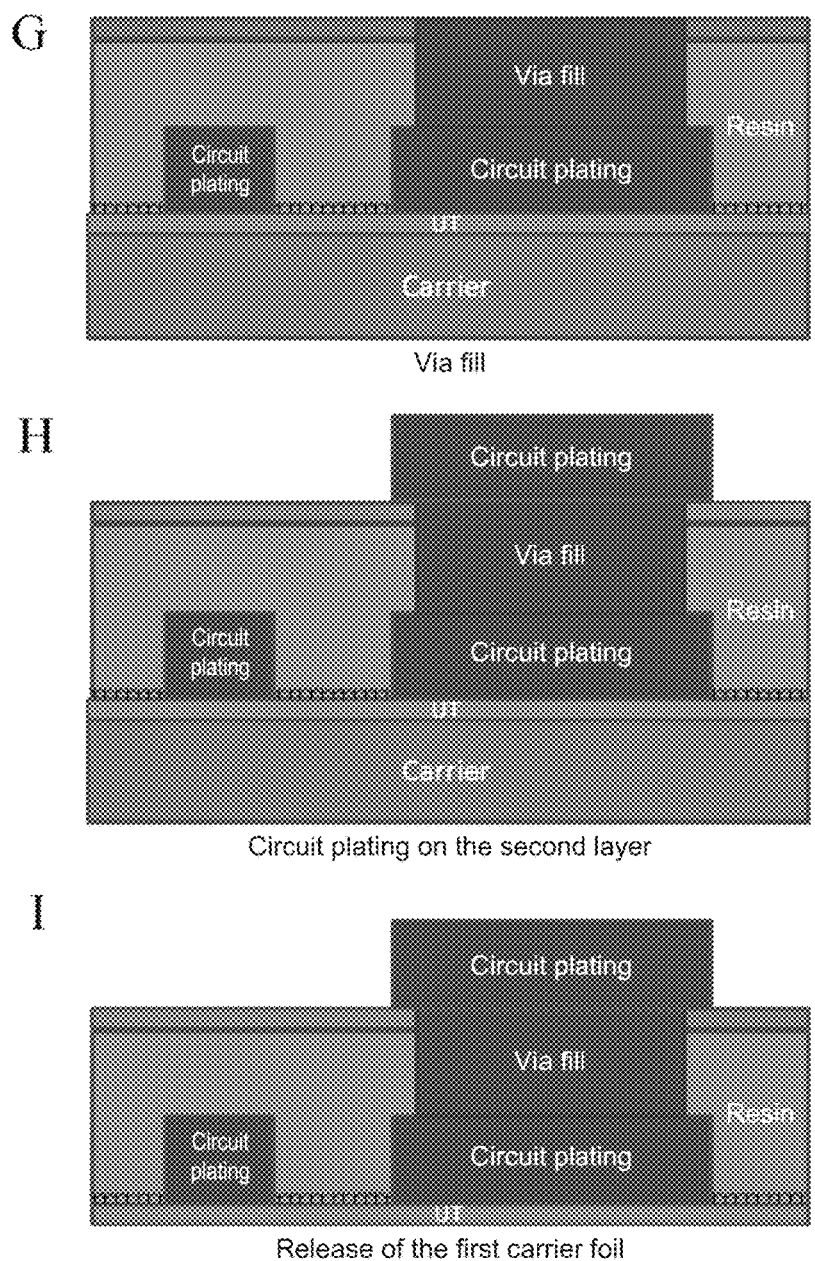

[Figure 4]
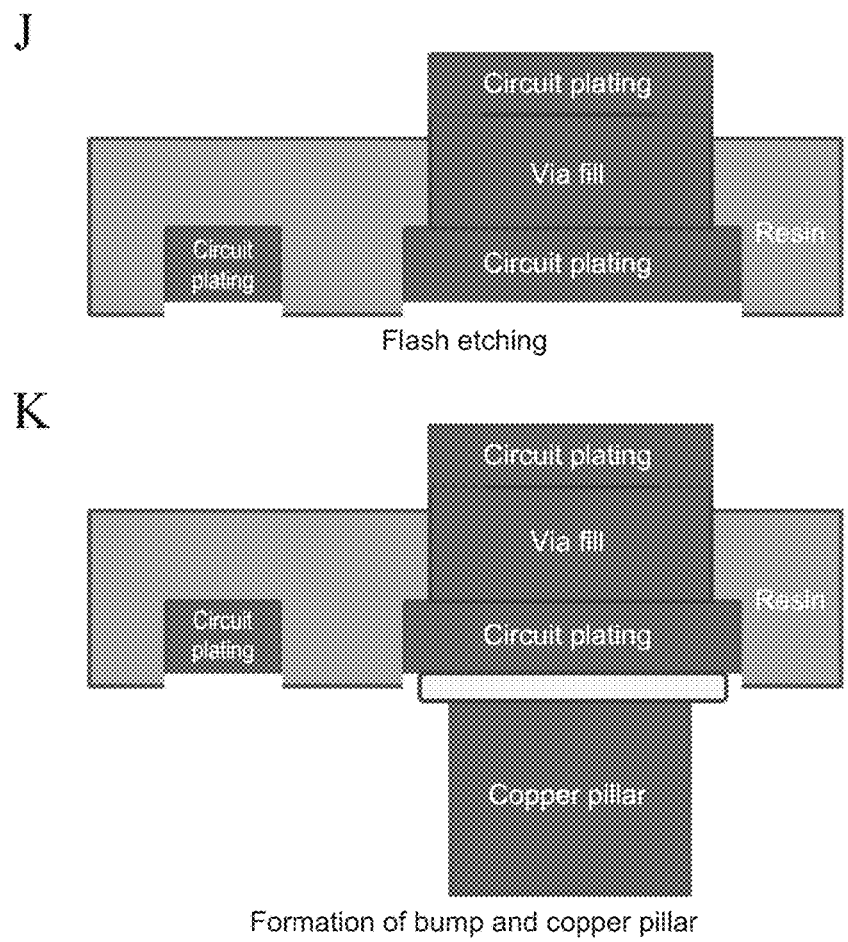

[Figure 5]
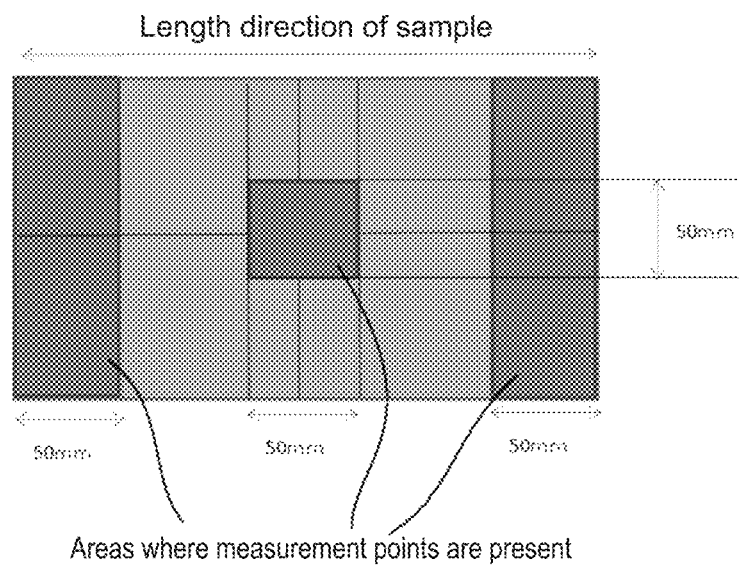
[Figure 6]
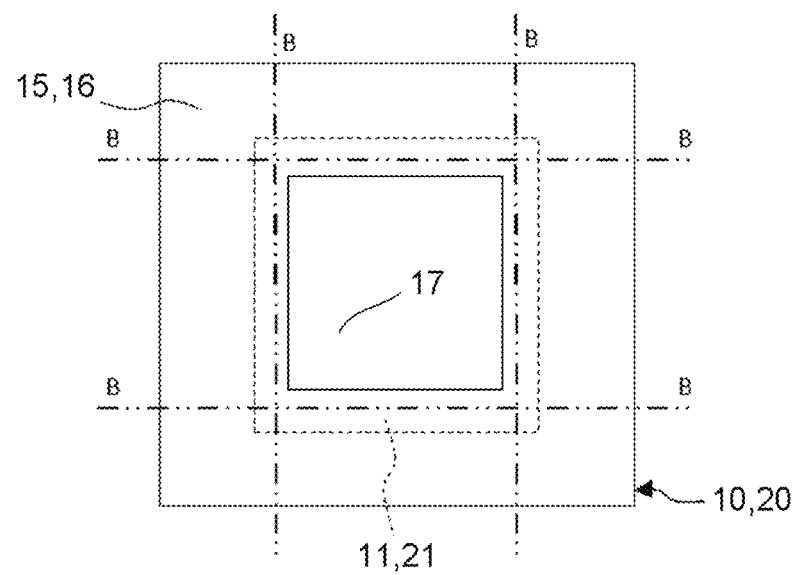

[Figure 7]
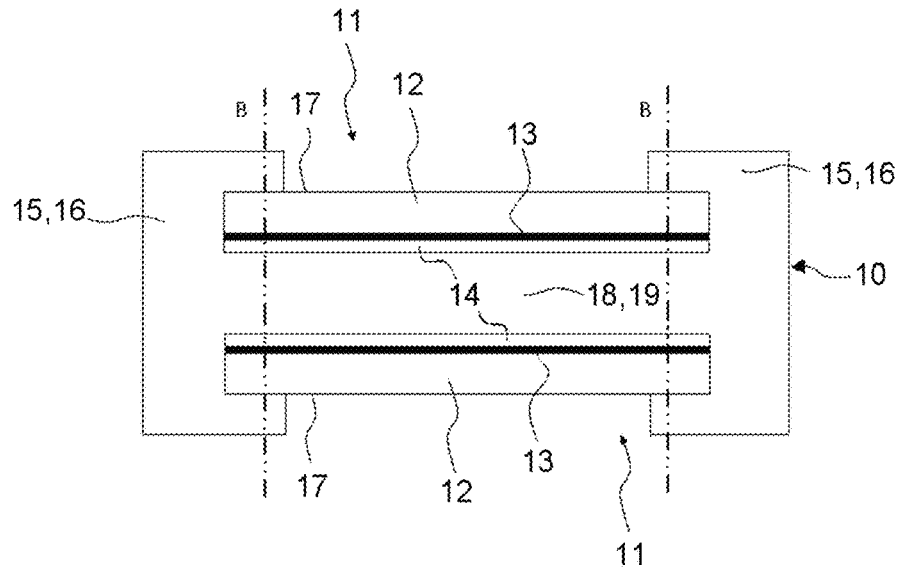
[Figure 8]
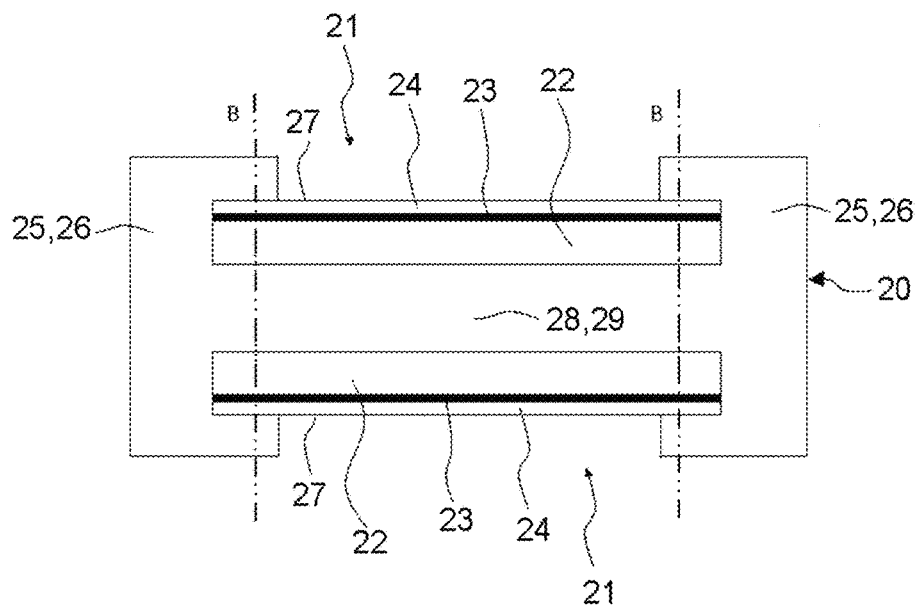

[Figure 9]
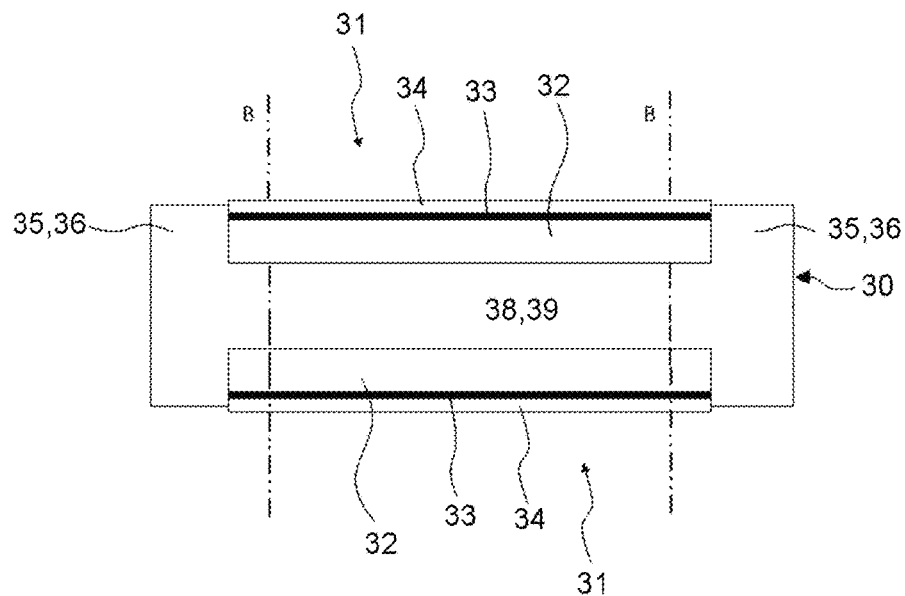
[Figure 10]
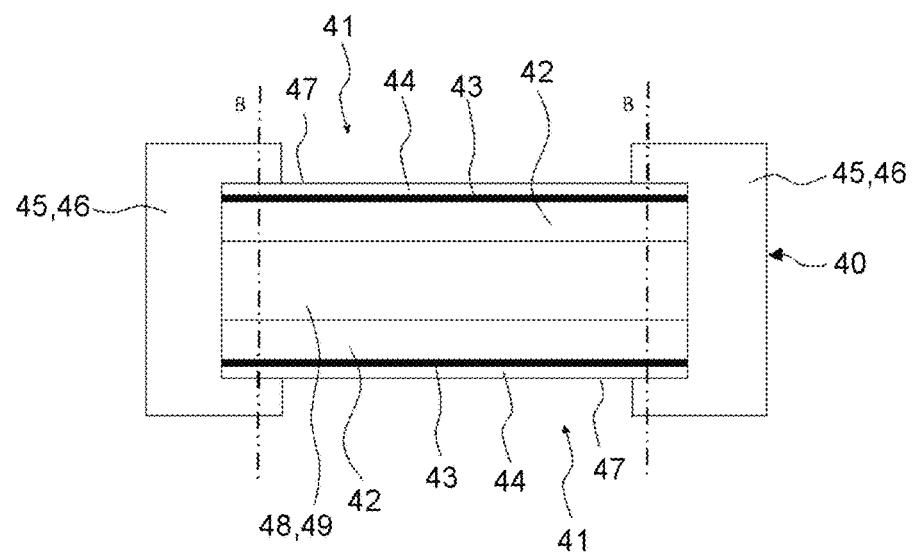

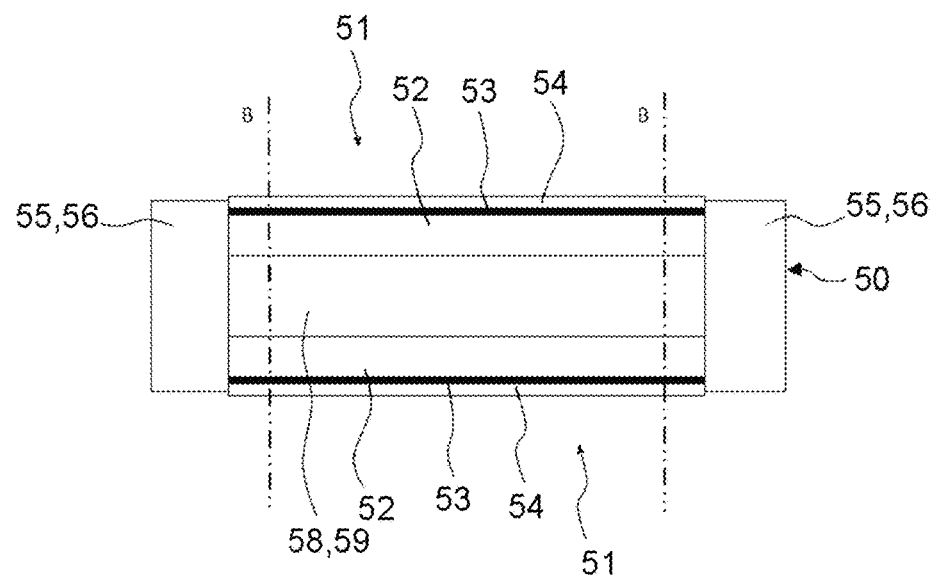
[Figure 11]

CARRIER-ATTACHED COPPER FOIL, LAMINATE, PRINTED-WIRING BOARD AND METHOD FOR MANUFACTURING THE PRINTED WIRING BOARD

TECHNICAL FIELD

The present invention relates to a carrier-attached copper foil, a laminate, a printed wiring board and a method for manufacturing the printed wiring board, and in particular, to a carrier-attached copper foil which is used for manufacturing a printed wiring board having a fine pattern, a laminate, a printed wiring board and a method for manufacturing the printed wiring board.

BACKGROUND ART

Printed wiring boards have made great progress over this half century, which have led to their use in almost all electronic devices today. With increasing needs for downsizing and higher performance of electronic devices in recent years, higher-density packaging of mounted components and higher frequencies of signals have progressed, thus miniaturization (finer pitch) of conductor patterns and adaptation to high frequencies are needed in printed wiring boards. In particular, if an IC chip is mounted on a printed wiring board, a finer pitch of L (Line)/S (Space)=20 μm/20 μm or less is required.

A printed wiring board is firstly manufactured as a copperclad laminate obtained by bonding a copper foil and an insulating substrate, which mainly include a glass epoxy substrate, a BT resin and a polyimide film. The bonding is performed by using a method of laminating an insulating substrate and a copper foil, and heated/pressured the resultant (lamination process) or a method of applying a varnish which is a precursor of an insulating substrate material to a side having a cover layer of a copper foil, then heating and curing the resultant (casting process).

The thickness of a copper foil used for a copper-clad laminate is made thinner and thinner in association with a finer pitch, in such a way that the foil thickness has become 9 μm, further 5 μm or smaller. However, when the foil thickness is 9 μm or smaller, handling property is greatly deteriorated in forming a copper-clad laminate by the aforementioned lamination process or casting process. To deal with the problem, carrier-attached copper foils have emerged utilizing a thick metal foil as a carrier, and having an ultra-thin copper layer formed thereon via a release layer. A general method of using the carrier-attached copper foil include bonding the surface of the ultra-thin copper layer to an insulating substrate and thermocompression bonding the resultant, then detaching the carrier via the release layer, as disclosed in Patent Literature 1, etc.

In the fabrication of a printed wiring board using the carrier-attached copper foil, a typical method of using the carrier-attached copper foil include firstly laminating the carrier-attached copper foil to an insulating substrate, then detaching the carrier from the ultra-thin copper layer. Next, a plating resist formed of a photo-curable resin is provided on the ultra-thin copper layer exposed by detaching the carrier. Next, predetermined areas of the plating resist are exposed to light so as to cure the areas. Subsequently, the uncured plating resist at unexposed areas are removed, then an electrolytic plating layer is provided at the areas in which the resist is removed. Next, the cured plating resist is removed, thereby obtaining the insulating substrate having a circuit formed thereon, and this is used to fabricate the printed wiring board.

CITATION LIST

Patent Literature

[Patent Literature 1] Japanese Patent Laid-Open No. 2006-022406

SUMMARY OF INVENTION

Technical Problem

In such a method of manufacturing the printed wiring board, the circuit formed on the insulating substrate corresponds to the geometry of the plating resist cured by the exposure to light. Thus, if the geometry of the cured plating resist is defective, the geometry of the circuit is also defective, making it difficult to form a fine pitch circuit. In the fabrication of the printed wiring board by using a so-called embedding process, that is, by forming a circuit plating on the surface of the ultra-thin copper layer of the carrier-attached copper foil, providing an embedding resin on the ultra-thin copper layer so that the formed circuit plating is covered (so that the circuit plating is buried) to laminate a resin layer thereon, drilling at predetermined positions of the resin layer to expose the circuit plating, and forming blind vias to electrically connect circuits or wiring between multiple layers of the laminate, the precision required for the positions of circuits between the layers is quite high, and it is required that the circuits are precisely formed in desired geometries and positions.

However, when a plating resist is provided on the surface of the ultra-thin copper layer and predetermined areas of the plating resist are exposed to light, the light transmits through the plating resist and reflects at the ultra-thin copper layer surface because the plating resist is generally light-transmissive. The reflected light in this case commonly include regularly reflected light which is reflected in the direction perpendicular to the ultra-thin copper layer surface, and diffusely reflected light which is not reflected vertically but is reflected in a spreading manner. Of these, the diffusely reflected light penetrates into areas other than areas which need to be cured of the plating resist, resulting in cured plating resist outside the areas which need to be cured. Thus, conventionally, there has been a problem that it is difficult to process the areas which need to be cured of the plating resist with precision, and it is difficult to form the corresponding circuit geometry with precision.

Then, an object of the present invention is to provide a carrier-attached copper foil with satisfactory circuit formability on the surface of the ultra-thin copper layer.

Solution to Problem

The present inventor intensively conducted studies in order to achieve the above object and found that it is very effective to control the light absorbance of the surface of the ultra-thin copper layer of the carrier-attached copper foil for improving the circuit formability on the surface of the ultra-thin copper layer.

The present invention was accomplished based on the above finding, and according to an aspect of the invention, there is provided a carrier-attached copper foil having a carrier, an intermediate layer and an ultra-thin copper layer in this order, wherein a surface of the ultra-thin copper layer has an absorbance of light at a wavelength of 400 nm of 85% or more.

In an embodiment of the carrier-attached copper foil of the invention, the surface of the ultra-thin copper layer has an absorbance of light at a wavelength of 400 nm of 87% or more.

In another embodiment of the carrier-attached copper foil of the invention, the surface of the ultra-thin copper layer has an absorbance of light at a wavelength of 400 nm of 90% or more.

In another embodiment of the carrier-attached copper foil of the invention, the surface of the ultra-thin copper layer has an absorbance of light at a wavelength of 400 nm of 91% or more.

In another embodiment of the carrier-attached copper foil of the invention, the surface of the ultra-thin copper layer has an absorbance of light at a wavelength of 400 nm of 92% or more.

In another embodiment of the carrier-attached copper foil of the invention, the surface of the ultra-thin copper layer has an absorbance of light at a wavelength of 400 nm of 93% or more.

In another embodiment of the carrier-attached copper foil of the invention, the surface of the ultra-thin copper layer has an absorbance of light at a wavelength of 400 nm of 95% or more.

In another embodiment of the carrier-attached copper foil of the invention, an average value of surface roughness Rz of the ultra-thin copper layer is 1.7 μm or less, as measured by a laser microscope in accordance with JIS B0601-1994.

In another embodiment of the carrier-attached copper foil of the invention, the carrier is made of an electrolytic copper foil or a rolled copper foil.

In another embodiment, the carrier-attached copper foil of the invention has a roughened layer on at least one surface or both surfaces of the ultra-thin copper layer and the carrier.

In another embodiment of the carrier-attached copper foil of the invention, the roughened layer is a layer formed of an element selected from the group consisting of copper, nickel, cobalt, phosphorus, tungsten, arsenic, molybdenum, chromium and zinc or an alloy containing at least one of these.

In another embodiment, the carrier-attached copper foil of the invention includes a resin layer on a surface of the roughened layer.

In another embodiment, the carrier-attached copper foil of the invention has at least one layer selected from the group consisting of a heat-resistant layer, a rustproofing layer, a chromate treated layer and a layer treated with a silane coupling agent on a surface of the roughened layer.

In another embodiment, the carrier-attached copper foil of the invention has at least one layer selected from the group consisting of a heat-resistant layer, a rustproofing layer, a chromate treated layer and a layer treated with a silane coupling agent on at least one surface or both surfaces of the ultra-thin copper layer and the carrier.

In another embodiment, the carrier-attached copper foil of the invention includes a resin layer on the at least one layer selected from the group consisting of a heat-resistant layer, a rustproofing layer, a chromate treated layer and a layer treated with a silane coupling agent.

In another embodiment, the carrier-attached copper foil of the invention includes a resin layer on the ultra-thin copper layer.

In another embodiment of the carrier-attached copper foil of the invention, the resin layer is an adhesive resin.

In another embodiment of the carrier-attached copper foil of the invention, the resin layer is a resin in a semi-cured state.

According to another aspect of the present invention, there is provided a laminate manufactured by using the carrier-attached copper foil of the invention.

In one embodiment, the laminate of the invention includes a pair of carrier-attached copper foils, wherein the pair of carrier-attached copper foils are laminated to each other, and wherein at least a part of a perimeter of the laminated portion of the carrier-attached copper foils is covered by a resin or prepreg in plan view of the carrier-attached copper foils.

In another embodiment, the laminate of the invention includes a pair of the carrier-attached copper foils, wherein the laminate is configured to have a resin or prepreg between the pair of the carrier-attached copper foils, and wherein at least a part of a perimeter of the laminated portion of the carrier-attached copper foils is covered by a resin or prepreg in plan view of the carrier-attached copper foils.

In another embodiment of the laminate of the invention, the whole perimeter of the laminated portion of the carrier-attached copper foils is covered by a resin or prepreg in plan view of the carrier-attached copper foils.

According to another aspect of the present invention, there is provided a printed wiring board manufactured by using the carrier-attached copper foil of the invention.

According to another aspect of the present invention, there is provided a method for manufacturing a printed wiring board, including a step of preparing the carrier-attached copper foil of the invention and an insulating substrate, a step of laminating the carrier-attached copper foil and the insulating substrate, a step of forming a copper-clad laminate by detaching carrier from the carrier-attached copper foil after the carrier-attached copper foil and the insulating substrate are laminated, and thereafter, a step of forming a circuit by any one of a semi-additive method, a subtractive method, a partly additive method or a modified semi-additive method.

According to another aspect of the present invention, there is provided a method for manufacturing a printed wiring board, including a step of forming a circuit on the surface of the ultra-thin copper layer of the carrier-attached copper foil according to according to the present invention or the surface of the carrier, a step of forming a resin layer on the surface of the ultra-thin copper layer of the carrier-attached metal foil or the surface of the carrier so as to bury the circuit, a step of forming a circuit on the resin layer a step of detaching the carrier or the ultra-thin copper layer after the circuit is formed on the resin layer, and a step of exposing the circuit buried in the resin layer and formed on the surface of the ultra-thin copper layer or the surface of the carrier by removing the ultra-thin copper layer or the carrier after the carrier or the ultra-thin copper layer is detached.

In one embodiment of the method for manufacturing a printed wiring board of the invention, the step of forming a circuit on the resin layer is a step of bonding another carrier-attached copper foil to the resin layer from the side of the ultra-thin copper layer and forming the circuit using the carrier-attached copper foil bonded to the resin layer.

In another embodiment of the method for manufacturing a printed wiring board of the invention, the another carrier-attached copper foil to be bonded to the resin layer is the carrier-attached copper foil of the invention.

In another embodiment of the method for manufacturing a printed wiring board of the invention, the step of forming a circuit on the resin layer is performed by any one of a semi-additive method, a subtractive method, a partly additive method or a modified semi-additive method.

In another embodiment, the method for manufacturing a printed wiring board of the invention further includes a step of forming a substrate on the surface of the carrier of the carrier-attached copper foil before detaching the carrier.

Advantageous Effect of Invention

According to the present invention, it is possible to provide a carrier-attached copper foil having satisfactory circuit formability on the surface of the ultra-thin copper layer.

BRIEF DESCRIPTION OF DRAWINGS

FIG. 1A-C is a schematic cross-sectional view of a wiring board at the steps up to the circuit plating/removal of the resist according to a specific example of the method for manufacturing a printed wiring board using the carrier-attached copper foil of the invention.

FIG. 2D-F is a schematic cross-sectional view of the wiring board at the steps from the lamination of the resin and the second carrier-attached copper foil to laser drilling according to a specific example of the method for manufacturing a printed wiring board using the carrier-attached copper foil of the invention.

FIG. 3G-I is a schematic cross-sectional view of the wiring board at the steps from via fill formation to the release of the first carrier according to a specific example of the method for manufacturing a printed wiring board using the carrier-attached copper foil of the invention.

FIG. 4J-K is a schematic cross-sectional view of the wiring board at the steps from flash etching to formation of a bump and a copper pillar according to a specific example of the method for manufacturing a printed wiring board using the carrier-attached copper foil of the invention.

FIG. 5 is a schematic view showing measurement points at a sample sheet according to Examples.

FIG. 6 is a schematic plan view of a laminate 10 according to one embodiment of the present invention.

FIG. 7 is a schematic cross-sectional view of the laminate 10 according to one embodiment of the present invention.

FIG. 8 is a schematic cross-sectional view of a laminate 20 according to another embodiment of the present invention.

FIG. 9 is a schematic cross-sectional view of a laminate 30 according to another embodiment of the present invention.

FIG. 10 is a schematic cross-sectional view of a laminate 40 according to another embodiment of the present invention.

FIG. 11 is a schematic cross-sectional view of a laminate 50 according to another embodiment of the present invention.

DESCRIPTION OF EMBODIMENTS

<Carrier-Attached Copper Foil>

A carrier-attached copper foil of the present invention has a carrier, an intermediate layer and an ultra-thin copper layer laminated in this order. Methods of using carrier-attached copper foils per se are well-known to those skilled in the art. For example, the surface of the ultra-thin copper layer is bonded to an insulating substrate such as a paper based phenol resin, a paper based epoxy resin, a synthetic fiber cloth based epoxy resin, a glass cloth/paper composite based epoxy resin, a glass cloth/non-woven glass cloth composite based epoxy resin and a glass cloth based epoxy resin, a polyester film and a polyimide film. After the resultant is thermocompression bonded, the carrier is detached. The ultra-thin copper layer adhered to the insulating substrate is etched to a target conductor pattern, and finally, a laminate (copper-clad laminate, etc.) or a printed wiring board and the like can be manufactured.

<Carrier>

The carrier that can be used in the present invention is typically a metal foil or a resin film and provided in the form of e.g., a copper foil, a copper-alloy foil, a nickel foil, a nickel-alloy foil, an iron foil, an iron-alloy foil, a stainless steel foil, an aluminum foil, an aluminum-alloy foil or an insulating resin film, a polyimide film, and an LCD film.

The carrier that can be used in the present invention is typically provided in the form of a rolled copper foil and an electrolytic copper foil. The electrolytic copper foil is generally produced by electrical precipitation of copper on a drum formed of titanium and stainless steel from a copper sulfate plating bath, whereas the rolled copper foil is produced by repeating plastic working by a mill roll and heat treatment. As the material for a copper foil, not only high-purity copper such as tough pitch copper (JIS H3100 Alloy Number C1100) and oxygen-free copper (JIS H3100 Alloy Number C1020 or JIS H3510 Alloy Number C1011) but also a copper alloy such as Sn-containing copper, Ag-containing copper, a copper alloy containing e.g., Cr, Zr or Mg, and a Corson copper alloy containing e.g., Ni and Si can be used. Note that, in the specification, the term "copper foil" as used singly also includes a copper-alloy foil.

The thickness of the carrier that can be used in the present invention, although it is not particularly limited, may be controlled to be such an appropriate thickness that allows the carrier to play a role, for example, 12 μm or more. However, if the thickness is extremely large, the production cost increases. Thus, generally, the thickness of the carrier is preferably 35 μm or less. Accordingly, the thickness of the carrier is typically 12 to 300 μm, more typically 12 to 150 μm, more typically 12 to 70 μm and more typically 18 to 35 μm.

<Intermediate Layer>

An intermediate layer is provided on one or both surfaces of the carrier. Another layer may be provided between the copper foil carrier and the intermediate layer. The intermediate layer to be used in the invention is not particularly limited as long as the ultra-thin copper layer is not easily detached from the carrier until a carrier-attached copper foil is laminated on an insulating substrate; whereas the ultra-thin copper layer is easily detached from the carrier after the carrier-attached copper foil is laminated on an insulating substrate. The intermediate layer of the carrier-attached copper foil of the invention may contain, for example, at least one element selected from the group consisting of Cr, Ni, Co, Fe, Mo, Ti, W, P, Cu, Al, Zn, an alloy thereof, a hydrate thereof, an oxide thereof and an organic compound. Furthermore, the intermediate layer may be formed of a plurality of layers.

For example, the intermediate layer can be constituted by forming a single metal layer formed of a single element selected from the group consisting of Cr, Ni, Co, Fe, Mo, Ti, W, P, Cu, Al and Zn or forming an alloy layer formed of at least one element selected from the group consisting of Cr, Ni, Co, Fe, Mo, Ti, W, P, Cu, Al and Zn, on the carrier; and then, on the resultant structure, forming a layer formed of a hydrate or an oxide of at least one element selected from the group consisting of Cr, Ni, Co, Fe, Mo, Ti, W, P, Cu, Al and Zn or a layer formed of an organic compound.

Alternatively, for example, the intermediate layer can be constituted by forming a single metal layer formed of a single element of the group of Cr, Ni, Co, Fe, Mo, Ti, W, P, Cu, Al and Zn or an alloy layer formed of at least one element selected from the group of Cr, Ni, Co, Fe, Mo, Ti, W, P, Cu, Al and Zn, on the carrier, and then, on the resultant structure, forming a single metal layer formed of an element selected from the group of Cr, Ni, Co, Fe, Mo, Ti, W, P, Cu, Al and Zn or an alloy layer formed of at least one element selected from the group of Cr, Ni, Co, Fe, Mo, Ti, W, P, Cu, Al and Zn. A layer configuration which can be used as an intermediate layer may be used for the other layer.

In the case where the intermediate layer is provided only one of the surfaces of a carrier, a rustproofing layer such as a Ni plated layer is preferably provided on the opposite surface of the carrier. Note that, in the case where the intermediate layer is provided by treatment with a chromate, treatment with zinc chromate or plating, it is believed that a part of metal attached such as chromium or zinc may have formed a hydrate or oxide, in some cases.

The intermediate layer can be formed, for example, by laminating, on the carrier, nickel, a nickel-phosphorus alloy or a nickel-cobalt alloy and chromium in this order. Since the adhesive force between nickel and copper is higher than that between chromium and copper, when an ultra-thin copper layer is detached, the ultra-thin copper layer can be detached at the interface between the ultra-thin copper layer and the chromium. The nickel contained in the intermediate layer is expected to exert a barrier effect, i.e., an effect of preventing diffusion of a copper component from the carrier to the ultra-thin copper layer. The amount deposited of nickel of the intermediate layer is preferably 100 µg/dm$^2$ or more and 40000 µg/dm$^2$ or less, more preferably 100 µg/dm$^2$ or more and 4000 µg/dm$^2$ or less, more preferably 100 µg/dm$^2$ or more and 2500 µg/dm$^2$ or less, and more preferably 100 µg/dm$^2$ or more and less than 1000 µg/dm$^2$. The amount deposited of chromium of the intermediate layer is preferably 5 µg/dm$^2$ or more and 100 µg/dm$^2$ or less. In the case where the intermediate layer is provided only one of the surfaces of a carrier, a rustproofing layer such as a Ni plated layer is preferably provided on the opposite surface of the carrier.

<Strike Plating>

An ultra-thin copper layer is provided on the intermediate layer. Before that, strike plating by a copper-phosphorus alloy may be applied in order to reduce the number of pinholes in the ultra-thin copper layer. As the strike plating, for example, a copper pyrophosphate plating liquid may be mentioned.

<Ultra-Thin Copper Layer>

The ultra-thin copper layer is provided on the intermediate layer. Note that another layer may be provided between the intermediate layer and the ultra-thin copper layer.

The ultra-thin copper layer can be formed by electroplating utilizing an electrolytic bath of copper sulfate, copper pyrophosphate, copper sulfamate, copper cyanide or the like. A copper sulfate bath is preferred because it is used for general electrolytic copper foils, and it enables formation of copper foils at high current densities. The thickness of the ultra-thin copper layer, although it is not particularly limited, is generally lower than the thickness of the carrier, for example, 12 µm or less. Typically 0.5 to 12 µm, more typically 1.5 to 5 µm and more typically 2 to 5 µm. Note that the ultra-thin copper layer may be provided on both surfaces of the carrier. A layer having a configuration which can be used as the intermediate layer may be used for the other layer.

The carrier-attached copper foil of the present invention can be used to fabricate the laminate (copper-clad laminate, etc.). Such a laminate may have a configuration "an ultra-thin copper layer/an intermediate layer/a carrier/a resin or prepreg" laminated in this order, or may have a configuration "an ultra-thin copper layer/an intermediate layer/a carrier/a resin or prepreg/a carrier/an intermediate layer/an ultra-thin copper layer" laminated in this order, for example. The resin or prepreg may be a resin layer as mentioned hereinafter, and may contain a resin, a resin curing agent, a compound, a curing accelerator, a dielectric substance, a reaction catalyst, a crosslinking agent, a polymer, a prepreg and a skeletal material used for a resin layer as mentioned hereinafter. Note that the carrier-attached copper foil may be smaller than the resin or prepreg as viewed planarly.

The laminate of the present invention may include a pair of carrier-attached copper foils of the present invention, and the pair of carrier-attached copper foils may be laminated to each other. In plan view of the carrier-attached copper foils, at least a part of the perimeter of the laminated portion of the carrier-attached copper foils may be covered by a resin or prepreg. In this case, the laminate may be configured to detachably contact the pair of carrier-attached copper foils with each other. Also, in plan view of the carrier-attached copper foils, the whole perimeter of the laminated portion of the carrier-attached copper foils may be covered with a resin or prepreg. According to this configuration, in plan view of the carrier-attached copper foils, the laminated portion of the carrier-attached copper foils is covered by the resin or prepreg, preventing other members from hitting this portion from the lateral directions of this portion, i.e., transverse directions with respect to the laminating direction. As a result, peeling of the carrier-attached copper foils from each other during handling can be reduced. The infiltration of a chemical liquid into this interface can be prevented in a treatment step with a chemical liquid as mentioned above, and corrosion or erosion of the carrier-attached copper foil can be prevented by covering with the resin or prepreg so as not to expose the perimeter of the laminated portion of the carrier-attached copper foil.

The laminate of the present invention may include a pair of carrier-attached copper foils of the present invention, and may be configured to have a resin or prepreg between the pair of carrier-attached copper foils. At least a part of the perimeter of the laminated portion of the carrier-attached copper foils may be covered with the resin or prepreg in plan view of the carrier-attached copper foils. As one example of such an embodiment, a specific configuration of a laminate in which the end of carrier-attached copper foils (i.e., the perimeter portion of the laminated portion of the carrier-attached copper foils in plan view of the carrier-attached copper foils) is covered with the resin or prepreg will be described with reference to figures. As illustrated in FIG. 6 (a schematic plan view of a laminate 10) and FIG. 7 (a schematic cross-sectional view of the laminate 10), the laminate 10 includes a pair of carrier-attached copper foils 11 of the present invention, and is configured to have a resin (resin plate 18) or a prepreg (prepreg plate 19) between the pair of carrier-attached copper foils 11 (carriers 12, intermediate layers 13, and ultra-thin copper layers 14). The laminate 10 is configured so that at least a part of the perimeter of the laminated portion of the carrier-attached copper foil 11 on the resin or prepreg is covered with a resin 15 or a prepreg 16 in plan view of the carrier-attached copper foils 11. As another embodiment, the laminate 10 may be configured so that the whole perimeter of the laminated portion of the carrier-attached copper foil 11 on the resin (resin plate 18) or the prepreg (prepreg plate 19) is covered with a resin 15 or a prepreg 16 in plan view of the carrier-attached copper foils 11.

According to this configuration, in plan view of the carrier-attached copper foils 11, the laminated portion of the carrier-attached copper foils 11 on the resin (resin plate 18) or the prepreg (prepreg plate 19) is covered by the resin 15 or prepreg 16, preventing other members from hitting this portion from the lateral directions of this portion, i.e., transverse directions with respect to the laminating direction. As a result, peeling of the carrier-attached copper foils 11 from each other during handling can be reduced. The infiltration of an chemical liquid into this interface can be prevented in a treatment step with an chemical liquid as mentioned above, and corrosion or erosion of the carrier-attached copper foil 11 can be prevented by covering with the resin 15 or prepreg 16 so as not to expose the perimeter of the laminated portion of the carrier-attached copper foil 11 on the resin (resin plate 18) or the prepreg (prepreg plate 19).

The resin 15 or prepreg 16 may cover the perimeter of the laminating portion of the carrier-attached copper foils 11 on the resin (resin plate 18) or the prepreg (prepreg plate 19) in such a way that the resin 15 or prepreg 16 has an aperture 17 in plan view of the carrier-attached copper foils 11. The carrier-attached copper foil 11 may be exposed at the aperture 17. The aperture 17 can be formed by, for example, common photolithography techniques, a technique of stacking a masking tape, masking sheet or the like, then etching off only the aperture 17, or pressure bonding or thermocompression bonding, etc. a laminated product obtained by contacting two carrier-attached copper foils 11 against the resin 15 or prepreg 16 by a press. The aperture 17 as viewed planarly may be formed in the inner side of the end (perimeter) of the carrier-attached copper foil 11, or may reach the end of the carrier-attached copper foil 11 or at least a part of the perimeter of the laminating portion of the two carrier-attached copper foils 11.

In the laminate 10 as illustrated in FIG. 7, the carrier-attached copper foils 11 are laminated in such a way that each of the ultra-thin copper layers 14 is on the inner side, but without being limited thereto, as in a laminate 20 as illustrated in FIG. 8, the lamination may be performed in such a way that each of ultra-thin copper layers 24 is on the outer side. Alternatively, one carrier-attached copper foil may be laminated in such a way that the ultra-thin copper layer is on the inner side, and the other carrier-attached copper foil may be laminated in such a way that the ultra-thin copper layer is on the outer side.

The laminate of the present invention, as illustrated in FIGS. 7 to 9, includes two or more laminated products in which a pair of carrier-attached copper foils 11, 21, 31 contacts with each other in one laminate 10, 20, 30. A resin plate 18, 28, 38 or a prepreg plate 19, 29, 39 provided between the pair of carrier-attached copper foils 11, 21, 31 and a resin 15, 25, 35 or a prepreg 16, 26, 36 may be integrally formed. That is, the resin plate 18, 28, 38 or the prepreg plate 19, 29, 39 and the resin 15, 25, 35 or the prepreg 16, 26, 36 may be heated and cured at the same timing to be integrally formed.

In the laminate of the present invention, as illustrated in FIGS. 10 and 11, a resin plate 48, 58 or a prepreg plate 49, 59 and a resin 45, 55 or a prepreg 46, 56 may be formed as separate members. That is, in a laminate 40, 50, the resin plate 48, 58 or the prepreg plate 49, 59 interposed between carrier-attached copper foils 41, 51 and the resin 45, 55 or the prepreg 46, 56 formed so as to cover the lamination plane from the side may be formed at different timings, so as not to integrally form the resin plate and the resin covering the lamination plane as in FIGS. 7 to 9. Note that, in FIGS. 10 and 11, the resin plate 48, 58 or the prepreg plate 49, 59 and the resin 45, 55 or the prepreg 46, 56 may be the same or different types. For example, the prepreg plate 49, 59 and the resin 45, 55 such as an epoxy resin can be used. Note that, the resin plate 18, 28, 38, 48, 58 or the prepreg plate 19, 29, 39, 49, 59 and the resin 15, 25, 35, 45, 55 or the prepreg 16, 26, 36, 46, 56 may be a resin layer as mentioned below, and may contain a resin, a resin curing agent, a compound, a curing accelerator, a dielectric substance, a reaction catalyst, a crosslinking agent, a polymer, a prepreg and a skeletal material used for the resin layer as described below.

The laminate 40, 50 as illustrated in FIGS. 10 and 11 may be fabricated by laminating each of carrier-attached copper foils 41, 51 on both surfaces of the resin plate 48, 58 or the prepreg plate 49, 59, if necessary, masking the carrier-attached copper foils 41, 51, for example, at the surfaces, applying a resin as mentioned below from the side with respect to the lamination plane, and heating and curing the resultant.

The laminate 10, 20, 30, 40, 50 as illustrated in FIGS. 6 to 11 may be a laminate cut out by cutting along the B-B lines. The B-B lines to be cutting positions are provided over the resin 15, 25, 45, prepreg 16, 26, 46 covering the perimeter of the laminate in FIGS. 6, 7, 8 and 10, but not limited to these. That is, the B-B lines to be cutting positions may be provided over the aperture 17, 27, 47.

<Roughening Treatment>

A roughened layer may be provided to the surface of the ultra-thin copper layer by applying a roughening treatment to the surface in order to improve adhesion to, for example, an insulating substrate.

Also, a roughened layer may be provided by applying a roughening treatment to the surface of the carrier. According to this configuration, when the carrier-attached copper foil of the present invention is laminated in an insulating substrate from the carrier side, the adhesion between the carrier and the insulating substrate improves, and the carrier and the insulating substrate are not easily detached in manufacturing steps of a printed wiring board.

The roughening treatment can be applied by forming roughening particles of e.g., copper or a copper alloy. The roughening particles may be small. The roughened layer may be a layer formed of an element selected from the group consisting of copper, nickel, cobalt, phosphorus, tungsten, arsenic, molybdenum, chromium and zinc or an alloy containing at least one of these. Alternatively, in the roughening treatment, roughening particles of copper or a copper alloy are formed, and then secondary particles or tertiary particles formed of e.g., nickel, cobalt, copper and zinc or an alloy of these are provided. Thereafter, a heat-resistant layer or a rustproofing layer may be formed of e.g., nickel, cobalt, copper, zinc or an alloy of these. Furthermore, the surface thereof may be treated with chromate and a silane coupling agent. Alternatively, a roughening treatment is not applied and a heat-resistant layer or a rustproofing layer is formed of, e.g., nickel, cobalt, copper and zinc or an alloy of these and the resultant surface may be treated with chromate and a silane coupling agent. In other words, to the surface of the roughened layer, at least one layer selected from the group consisting of a heat-resistant layer, a rustproofing layer, a chromate treated layer and a layer treated with a silane coupling agent may be formed; or at least one layer selected from the group consisting of a heat-resistant layer, a rust-proofing layer, a chromate treated layer and a layer treated with a silane coupling agent may be formed on at least one surface or both surfaces of the ultra-thin copper layer and the carrier. Note that the aforementioned heat-resistant layer, rustproofing layer, chromate treated layer and layer treated with a silane coupling agent are each formed of a plurality of layers (for example, two layers or more, three layers or more). Note that these surface treatments have little effect on the surface roughness of the ultra-thin copper layer.

The roughening treatment can be applied by forming roughening particles of e.g., copper or a copper alloy. The roughened layer is preferably formed of fine particles in terms of fine pitch formation. With respect to electroplating conditions for forming the roughening particles, the particles tend to be smaller with higher current densities, lower copper concentrations in the plating liquid, or larger quantities of coulomb.

Specifically, methods of roughening the ultra-thin copper layer of the carrier-attached copper foil of the present invention can be performed by any of the following (1) to (4).

(1) Increasing the current density at the roughening treatment, thereby refining the projections and recesses on the surface of the ultra-thin copper layer surface, and the projections and recesses of the surface increase, thus light is more easily absorbed.

(2) The amount of coulomb at the roughening treatment is increased, thereby increasing the projections and recesses on the surface of the ultra-thin copper layer surface and aggregation of particles, thus light is more easily absorbed.

(3) The roughening treatment time at the roughening treatment is increased, thereby increasing the projections and recesses on the surface of the ultra-thin copper layer surface and aggregation of particles, thus light is more easily absorbed.

(4) An added element which serves to reduce the roughening particles (e.g., Ni, Co, W, As) is added to the process liquid, thereby refining the projections and recesses on the surface of the ultra-thin copper layer surface, and the projections and recesses of the surface increase, thus light is more easily absorbed.

The above-mentioned methods of roughening the ultra-thin copper layer of the carrier-attached copper foil of the present invention will be more specifically described below.

In the case where the roughening treatment is copper-alloy roughening plating (roughening plating conducted in a plating bath where the copper concentration in the plating liquid is a comparable value to the concentrations of other elements, or one several tenth to several ten times, preferably several times to several ten times of the concentrations of other elements):

(A) where a primary roughening treatment is not conducted (any one or more of the following (a) and (b) may be satisfied)
 (a) In the plating conditions of the copper-alloy roughening plating, the current density is controlled to 40 to 60 A/dm$^2$. Also, the roughening treatment time is controlled to 1 to 10 seconds, and the amount of coulomb is controlled to 45 to 300 As/dm$^2$.
 (b) In the plating conditions of the copper-alloy roughening plating, the amount of coulomb is controlled to 200 to 300 As/dm$^2$. Also, the roughening treatment time is controlled to 1 to 10 seconds, and the current density is controlled to 30 to 45 As/dm$^2$.

(B) where a primary roughening treatment is conducted (any two or more of the following (c) to (e) may be satisfied):
 (c) In the plating conditions of the copper-alloy roughening plating, the current density is controlled to 52 to 65 A/dm$^2$.
 (d) In the plating conditions of the copper-alloy roughening plating, the roughening treatment time is controlled to 6 to 16 seconds.
 (e) In the plating conditions of the copper-alloy roughening plating, the amount of coulomb is controlled to 60 to 80 As/dm$^2$.

In the case where the roughening treatment is copper roughening plating (roughening plating conducted in a plating bath where the copper concentration in the plating liquid is more than 100 times higher than the concentrations of other elements):

At least two stages of roughening treatment is conducted including roughening plating 1, and subsequent roughening plating 2. At this time, the roughening treatment is conducted so as to satisfy any of the following (f) and (g).
 (f) The amount of coulomb in the first-stage roughening treatment is controlled to 600 As/dm$^2$ or more.
 (g) The current density in the second-stage roughening treatment is controlled to 0.5 to 13 A/dm$^2$, and the amount of coulomb is controlled to 0.05 to 1000 As/dm$^2$. Also, at this time, the roughening treatment time is preferably 0.1 to 20 seconds.

(Surface Roughness Rz)

When the surface roughness Rz (ten point height of roughness profile) of the ultra-thin copper layer as measured by a laser microscope in accordance with JIS B0601-1994 is 1.7 µm or less, occurrence of migrations in a circuit formed on the surface can be satisfactory suppressed, which is very advantageous in terms of fine pitch formation. The average value of Rz is preferably 1.6 µm or less, more preferably 1.5 µm or less, more preferably 1.4 µm or less, more preferably 1.3 µm or less, more preferably 1.2 µm or less, more preferably 1.0 µm or less, and more preferably 0.8 µm or less. However, if the average value of Rz is extremely small, the adhesion with the resin decreases. Thus, the average value of Rz is preferably 0.01 µm or more, more preferably 0.1 µm or more, still more preferably 0.3 µm or more, and most preferably 0.5 µm or more.

Note that, in the present invention, the surface roughness (Rz) of the ultra-thin copper layer represents the roughness of the surface on the surface-treated side when the ultra-thin copper layer has been surface treated. Note that, when an insulating substrate such as a resin is adhered to the surface of the ultra-thin copper layer, as in a printed wiring board or a copper-clad laminate, the above-mentioned surface roughness (Rz) for the copper circuit or the surface of the copper foil can be measured by dissolving and removing the insulating substrate.

(Light Absorbance)

In the carrier-attached copper foil of the present invention, the surface of the ultra-thin copper layer is controlled to have an absorbance of light at a wavelength of 400 nm of 85% or more. The carrier-attached copper foil is laminated on an insulating substrate from the ultra-thin copper layer side, and the carrier is detached, then a circuit is formed on the exposed surface of the ultra-thin copper layer. At this time, a plating resist is firstly provided on the surface of the ultra-thin copper layer (in the present invention, when the surface of the ultra-thin copper layer has been subject to surface treatment such as roughening treatment, the "surface of the ultra-thin copper layer" refers to the surface of the ultra-thin copper layer after the surface treatment), and predetermined areas of the plating resist is exposed to light. In general, the plating resist is light transmissive, and thus the light passes through the plating resist and is reflected at the surface of the ultra-thin copper layer. The reflected light at this time includes, in general, regularly reflected light which is reflected in the direction perpendicular to the surface of the ultra-thin copper layer, and diffuse reflected light which is not reflected vertically but is reflected in a spreading manner. Of these, the diffuse reflected light can penetrate into areas other than areas to be cured of the plating resist, and can cure the plating resist outside the areas to be cured. To address this, in the present invention, the absorbance of light at a wavelength of 400 nm of the surface of the ultra-thin copper layer is controlled to 85% or more, and thus the light transmitted through the plating resist at the light exposure is absorbed at the surface of the ultra-thin copper layer, thereby suppressing the reflection of light at the surface of the ultra-thin copper layer. Therefore, unwanted curing of the plating resist can be suppressed, and the areas to be cured of the plating resist can be processed with precision, thereby forming the corresponding circuit geometry with precision. The absorbance of light at a wavelength of 400 nm of the surface of the ultra-thin copper layer is preferably 87% or more, more preferably 90% or more, still more preferably 91% or more, still more preferably 92% or more, still more preferably 93% or more, and still more preferably 95% or more. The absorbance of light at a wavelength of 400 nm of the surface of the ultra-thin copper layer is at most 100%, typically 99.9% or less, typically 99.5% or less, and 99.3% or less.

<Printed Wiring Board and Laminate>

A laminate (copper-clad laminate, etc.) can be fabricated by bonding the carrier-attached copper foil to an insulating resin board from the side of ultra-thin copper layer, thermocompression bonding the resultant, and detaching the carrier. Subsequently, a copper circuit of the printed wiring board can be formed by etching the ultra-thin copper layer portion. The insulating resin board used herein is not particularly limited as long as it has properties applicable to a printed wiring board. Examples of the resin board that can be used for a rigid PWB (printed wiring board) include a paper based phenol resin, a paper based epoxy resin, a synthetic fiber cloth based epoxy resin, a glass cloth/paper composite based epoxy resin, a glass cloth/non-woven glass cloth composite based epoxy resin and a glass cloth based epoxy resin. Examples of the resin board that can be used for an FPC (flexible printed circuit) include a polyester film and a polyimide film. The printed wiring board or the laminate thus fabricated can be mounted on various electronic components where high-density packaging of mounted components is required.

Note that in the present invention, the "printed wiring board" is defined to include a printed wiring board provided with components, a printed circuit board and a printed board. Two or more printed wiring boards of the present invention can be connected to produce a printed wiring board in which two or more printed wiring boards are connected. Furthermore, at least one printed wiring board of the present invention and another printed wiring board of the present invention or a printed wiring board except the printed wiring board of the present invention may be connected and used to form electronic devices. Note that, in the present invention, the "copper circuit" is defined to include a copper wiring.

The carrier-attached copper foil may include a roughened layer on the ultra-thin copper layer, and may include at least one layer selected from the group consisting of a heat-resistant layer, a rustproofing layer, a chromate treated layer and a layer treated with a silane coupling agent on the roughened layer.

The carrier-attached copper foil may include a roughened layer on the ultra-thin copper layer; a heat-resistant layer or a rustproofing layer on the roughened layer, a chromate treated layer on the heat-resistant layer or the rustproofing layer; and a layer treated with a silane coupling agent on the chromate treated layer.

The carrier-attached copper foil may include a resin layer on the ultra-thin copper layer, on the roughened layer, or on the heat-resistant layer, the rustproofing layer, the chromate treated layer or the layer treated with a silane coupling agent.

The resin layer may be an adhesive layer and may be an insulating resin layer in a semi-cured state (B-stage), serving as an adhesive. The semi-cured state (B-stage) include a state where the surface thereof is not sticky if touched by a finger; the insulating resin layers of this state can be laminated and stored; and a curing reaction proceeds if a heating treatment is further applied.

The resin layer may contain a thermosetting resin or may be formed of a thermoplastic resin. The resin layer may contain a thermoplastic resin. The resin layer may contain e.g., a resin known in the art, a resin curing agent, a compound, a curing accelerator, a dielectric substance, a reaction catalyst, a crosslinking agent, a polymer, a prepreg and a skeletal material. Furthermore, the resin layer may be formed of the substances (resins, resin curing agents, compounds, curing accelerator, a dielectric substance, reaction catalyst, crosslinking agent, a polymer, a prepreg and a skeletal material) described, for example in International Publication No. WO2008/004399, International Publication No. WO2008/053878, International Publication No. WO2009/084533, Japanese Patent Laid-Open No. 11-5828, Japanese Patent Laid-Open No. 11-140281, Japanese Patent No. 3184485, International Publication No. WO97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO2006/028207, Japanese Patent No. 4828427, Japanese Patent Laid-Open No. 2009-67029, International Publication No. WO2006/134868, Japanese Patent No. 5046927, Japanese Patent Laid-Open No. 2009-173017, International Publication No. WO2007/105635, Japanese Patent No. 5180815, International Publication No. WO2008/114858, International Publication No. WO2009/008471, Japanese Patent Laid-Open No. 2011-14727, International Publication No. WO2009/001850, International Publication No. WO2009/145179, International Publication No. WO2011/068157 and Japanese Patent Laid-Open No. 2013-19056; by using a method for forming a resin layer and/or a forming apparatus.

The type of resin forming the resin layer is not particularly limited and preferably a resin containing at least one selected from the group consisting of an epoxy resin, a polyimide resin, a polyfunctional cyanate compound, a maleimide compound, a polymaleimide compound, a maleimide resin, an aromatic maleimide resin, a polyvinyl acetal resin, a urethane resin, polyether sulfone, a polyether sulfone resin, an aromatic polyamide resin, an aromatic polyamide resin polymer, a rubber resin, a polyamine, an aromatic polyamine, a polyamide-imide resin, a rubber modified epoxy resin, a phenoxy resin, carboxyl group-modified acrylonitrile-butadiene resin, a polyphenylene oxide, a bismaleimide triazine resin, a thermosetting polyphenylene oxide resin, a cyanate resin, an anhydride of a carboxylic acid, an anhydride of a polybasic carboxylic acid, a linear polymer having a crosslinkable functional group, a polyphenylene ether resin, 2,2-bis(4-cyanatophenyl)propane, a phosphorus-containing phenol compound, manganese naphthenate, 2,2-bis(4-glycidylphenyl)propane, a polyphenylene ether-cyanate resin, a siloxane-modified polyamide-imide resin, a cyano ester resin, a phosphazene resin, a rubber-modified polyamide-imide resin, isoprene, a hydrogenated polybutadiene, polyvinyl butyral, phenoxy, a polymer epoxy, an aromatic polyamide, a fluorine resin, a bisphenol, a polyimide block copolymer resin and a cyano ester resin.

The epoxy resin has two or more epoxy groups in a molecule. Any epoxy resin can be used without problems as long as it can be used as an electrical/electron material. An epoxy resin obtained by epoxylating a compound having two or more glycidyl groups in a molecule is preferable. As the epoxy resin, a single resin selected from the group consisting of a bisphenol A type epoxy resin, a bisphenol F type epoxy resin, a bisphenol S type epoxy resin, a bisphenol AD type epoxy resin, a Novolak type epoxy resin, a cresol Novolak type epoxy resin, an alicyclic epoxy resin, a brominated epoxy resin, a phenol Novolak type epoxy resin, a naphthalene type epoxy resins, a brominated bisphenol A type epoxy resin, an o-cresol Novolak type epoxy resin, a rubber-modified bisphenol A type epoxy resin, a glycidyl amine type epoxy resin, triglycidyl isocyanurate, a glycidyl amine compound such as a N,N-diglycidylaniline, glycidyl ester compound such as diglycidyl tetrahydrophthalate, a phosphorus-containing epoxy resin, a biphenyl type epoxy resin, a biphenyl Novolak type epoxy resin, a trishydroxy-phenylmethane type epoxy resin and a tetraphenyl ethane epoxy resin, may be used, or two or more resins selected from the aforementioned group are used as a mixture. Alternatively, these epoxy resins can be hydrogenated or halogenated and put in use.

As the phosphorus-containing epoxy resin, a phosphorus-containing epoxy resin known in the art can be used. The phosphorus-containing epoxy resin is preferably an epoxy resin derived from, a compound having two or more epoxy groups in a molecule such as 9,10-dihydro-9-oxa-10-phospha-phenanthrene-10-oxide.

(Case where the Resin Layer Contains a Dielectric Substance (Dielectric Substance Filler))

The resin layer may contain a dielectric substance (dielectric substance filler).

If a dielectric substance (dielectric substance filler) is added in any one of the above resin layers or resin compositions, the dielectric substance can be used for forming a capacitor layer to enhance the electric capacitance of the capacitor circuit. As the dielectric substance (dielectric substance filler), a powdery dielectric substance formed of a composite oxide having a perovskite structure such as $BaTiO_3$, $SrTiO_3$, $Pb(Zr-Ti)O_3$ (alias PZT), $PbLaTiO_3 \cdot PbLaZrO$ (alias PLZT) and $SrBi_2Ta_2O_9$ (alias SBT), is used.

A dielectric substance (dielectric substance filler) may be a powder. If the dielectric substance (dielectric substance filler) is a powder, the dielectric substance (dielectric substance filler) preferably has a particle size within the range of 0.01 μm to 3.0 μm and preferably 0.02 μm to 2.0 μm. Note that the particle size of the dielectric substance is obtained as follows. An image of a dielectric substance particle is photographed by a scanning electron microscope (SEM). Then, linear lines were drawn on the photographic image of a dielectric substance particle. The length of the longest line crossing the image is defined as the diameter of the dielectric substance particle. The average of diameters of the dielectric particles in the field of view is defined as a particles size of the dielectric substance.

A resin and/or a resin composition and/or a compound contained in the aforementioned resin layer are dissolved in a solvent such as methyl ethyl ketone (MEK), cyclopentanone, dimethylformamide, dimethylacetamide, N-methylpyrrolidone, toluene, methanol, ethanol, propylene glycol monomethyl ether, dimethylformamide, dimethylacetamide, cyclohexanone, ethyl cellosolve, N-methyl-2-pyrrolidone, N,N-dimethylacetamide and N,N-dimethylformamide to obtain a resin liquid (resin vanish) The resin liquid is applied to a surface on the ultra-thin copper layer side of a carrier-attached copper foil as mentioned above in accordance with e.g., a roll coater method and, if necessary, dried by heating to remove the solvent to obtain B-stage of the resin. In the drying operation, for example a hot-air drying furnace may be used. The drying temperature may be 100 to 250° C. and preferably 130 to 200° C. The composition of the resin layer is dissolved in a solvent to obtain a resin liquid containing a resin solid substance of 3 wt % to 70 wt %, preferably, 3 wt % to 60 wt %, preferably 10 wt % to 40 wt % and more preferably 25 wt % to 40 wt %. Note that using a solvent mixture of methyl ethyl ketone and cyclopentanone in dissolving is most preferable from an environment point of view, at present. Note that a solvent having a boiling point within the range of 50° C. to 200° C. is preferable used.

The resin layer is preferably a semi-cured resin film having a resin flow, which is measured in accordance with MIL-P-13949G of the MIL standard, within the range of 5% to 35%.

In the specification, the resin flow is obtained as follows. In accordance with the MIL standard (MIL-P-13949G), four 10 cm-square samples are taken from a resin-attached surface-treated copper foil having a resin thickness of 55 μm. The four samples are laminated (laminate) and bonded at a press temperature of 171° C., a press pressure of 14 kgf/cm², for a press time of 10 minutes. At that time, the weight of resin flow is measured and the measurement results are substituted in Expression 1 to obtain a value of resin flow.

$$\text{Resin flow (\%)} = \frac{\text{Weight of resin flowing out}}{\text{(Laminate weight)} - \text{(Copper foil weight)}} \times 100 \quad [\text{Expression 1}]$$

The surface-treated copper foil having the resin layer (resin-attached surface-treated copper foil) is used in the following manner. After the resin layer is laminated on a substrate, the entire construct is subjected to thermocompression to cure the resin layer. If the surface-treated copper foil is an ultra-thin copper layer of a carrier-attached copper foil, the carrier is detached to expose the ultra-thin copper layer (naturally, the surface of the ultra-thin copper layer on the side near the intermediate layer is exposed). A predetermined wiring pattern is formed on the surface of surface-treated copper foil opposite to the surface to which a roughening treatment is applied.

If the resin-attached surface-treated copper foil is used, the number of prepreg material used during manufacturing of a multilayer printed wiring board can be reduced. In addition, the thickness of the resin layer is controlled such that interlayer insulation can be ensured and a copper-clad laminate can be produced even if a prepreg material is not used at all. At this time, if the surface of the substrate is undercoated with an insulating resin, smoothness of the surface can be further improved.

Note that the case where a prepreg material is not used is economically favorable because the cost for a prepreg material can be saved and the laminating step is simplified. In addition, the thickness of the resultant multilayer printed circuit board can be reduced by the thickness of the prepreg material. As a result, an ultra-thin multilayer printed wiring board (a thickness of a single layer: 100 m or less) is advantageously produced.

The thickness of the resin layer is preferably 0.1 to 500 μm, more preferably 0.1 to 300 μm, more preferably 0.1 to 200 μm, and more preferably 0.1 to 120 μm.

If the thickness of the resin layer is lower than 0.1 μm, adhesive force reduces. If such a resin-attached carrier-attached copper foil is laminated on a substrate having an interlayer material without interposing a prepreg material, it is sometimes difficult to ensure interlayer insulation with the circuit of the interlayer material. In contrast, if the thickness of the resin layer is larger than 120 μm, it becomes difficult to form a resin layer having a desired thickness in a single coating step and an extra material cost and a number of steps are required. This case may be economically disadvantageous.

Note that if the carrier-attached copper foil having a resin layer is used for forming the ultra-thin multilayer printed wiring board, the resin layer having a thickness of 0.1 μm to 5 μm, more preferably 0.5 μm to 5 μm and more preferably 1 μm to 5 μm is preferably used for reducing the thickness of the multilayer printed wiring board.

If the resin layer contains a dielectric substance, the thickness of the resin layer is preferably 0.1 to 50 μm, preferably 0.5 μm to 25 μm, and more preferably 1.0 μm to 15 μm.

The total thickness of the cured resin layer and the semi-cured resin layer is preferably 0.1 μm to 120 μm, preferably 5 μm to 120 μm, preferably 10 μm to 120 μm, and more preferably 10 m to 60 μm. The thickness of the cured resin layer is preferably 2 μm to 30 μm, 3 μm to 30 μm, and more preferably 5 to 20 μm. The thickness of the semi-cured resin layer is preferably 3 μm to 55 μm, 7 μm to 55 μm, and more desirably 15 to 115 μm. If the total thickness of the resin layers is greater than 120 μm, it can become difficult to produce a thin multilayer printed wiring board. If the total thickness is less than 5 μm, it becomes easy to form a thin multilayer printed wiring board, but the resin layer which serves as an insulator layer between interlayer circuits becomes too thin. This can create a tendency to destabilize the insulation between interlayer circuits. If the thickness of the cured resin layer is less than 2 μm, the surface roughness of the roughened surface of the copper foil needs to be taken into consideration, in some cases. In contrast, the thickness of the cured resin layer is greater than 20 μm, the effect by the cured resin layer may not particularly improve, and the total thickness of insulator layers becomes thick.

Note that if the thickness of the resin layer is 0.1 μm to 5 μm, it is preferred that a heat-resistant layer and/or a rustproofing layer and/or a chromate treated layer and/or a layer treated with a silane coupling agent is provided on the ultra-thin copper layer, then the resin layer is formed on the heat-resistant layer or rustproofing layer or chromate treated layer or layer treated with a silane coupling agent in order to improve the adhesion between the resin layer and the carrier-attached copper foil.

The thickness of the resin layer as described above refers to an average value of thicknesses measured by cross-sectional observation at arbitrary 10 points.

Furthermore, as another product form of the resin-attached carrier-attached copper foil, it can also be produced in the form of a resin-attached copper foil without a carrier by covering the ultra-thin copper layer, or the heat-resistant layer, rustproofing layer, or the chromate treated layer, or the layer treated with a silane coupling agent with a resin layer, and making the resin layer in a semi-cured state, then detaching the carrier.

Furthermore, another product form of the resin-attached carrier-attached copper foil can also be produced as follows. The ultra-thin copper layer, or the heat-resistant layer, rust-proofing layer, or the chromate treated layer, or the layer treated with a silane coupling agent is covered with a resin layer, and the resin layer is made in a semi-cured state, then the carrier is detached to obtain a resin-attached copper foil without a carrier.

<Method of Manufacturing a Printed Wiring Board>

In an embodiment of the method of manufacturing a printed wiring board according to the present invention, the method of the invention includes a step of preparing a carrier-attached copper foil according to the present invention and an insulating substrate, a step of laminating the carrier-attached copper foil and the insulating substrate;

a step of detaching the carrier from the carrier-attached copper foil (after the carrier-attached copper foil and the insulating substrate are laminated such that an ultra-thin copper layer faces the insulating substrate), to form a copper-clad laminate; and thereafter a step of forming a circuit by any one of a semi-additive method, a modified semi-additive method, a partly additive method and a subtractive method. The insulating substrate may have an inner layer circuit.

In the present invention, the semi-additive method refers to a method of forming a conductive pattern by applying non-electrolytic plating onto an insulating substrate or a copper foil seed layer to form a thin plating layer, forming a pattern, and thereafter applying electroplating and etching.

Accordingly, in the embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated);

a step of completely removing an ultra-thin copper layer exposed by detaching the carrier by e.g., an etching method using a corrosive solution such as an acid, or a plasma method;

a step of forming through-holes or/and blind vias in the resin exposed by removing the ultra-thin copper layer by etching, a step of applying a desmear treatment to a region containing the through-holes or/and blind vias, a step of providing an non-electrolytic plating layer on the region containing the resin, the through-holes or/and blind vias, a step of forming a plating resist on the non-electrolytic plating layer, a step of applying light to the plating resist to remove the plating resist of a region in which the circuit is to be formed, a step of forming an electrolytic plating layer on the region in which the circuit is to be formed and the plating resist has been removed a step of removing the plating resist; and a step of removing the non-electrolytic plating layer present in the region except the region in which the circuit is to be formed, by e.g., flash etching.

In another embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated);

a step of completely removing an ultra-thin copper layer exposed by detaching the carrier by an etching method using a corrosive solution such as an acid, or a plasma method;

a step of forming a non-electrolytic plating layer on the surface of the resin exposed by removing the ultra-thin copper layer by etching, a step of forming a plating resist on the non-electrolytic plating layer, a step of applying light to the plating resist, and thereafter removing the plating resist of a region in which the circuit is to be formed, a step of forming an electrolytic plating layer on the region in which the circuit is to be formed and the plating resist has been removed;

a step of removing the plating resist; and a step of removing the non-electrolytic plating layer and the ultra-thin copper layer present in the region except the region in which the circuit is to be formed, by e.g., flash etching.

In the present invention, the modified semi-additive method refers to a method of forming a circuit on an insulating layer by laminating a metal foil on an insulating layer, protecting a non-circuit forming portion with a plating resist, thickening a circuit forming portion with copper by electrolytic plating, removing the resist and removing the metal foil of the region except the circuit forming portion by (flash) etching.

Accordingly, in the embodiment of the method of manufacturing a printed wiring board according to the present invention using the modified semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated);

a step of forming through-holes or/and blind vias in the ultra-thin copper layer exposed by detaching the carrier and the insulating substrate, a step of applying a desmear treatment to a region containing the through-holes or/and blind vias, a step of providing an non-electrolytic plating layer on the region containing the through-holes or/and blind vias, a step of forming a plating resist on the surface of the ultra-thin copper layer exposed by detaching the carrier, a step of forming a circuit by electro plating (after the plating resist is formed), a step of removing the plating resist; and a step of removing the ultra-thin copper layer exposed by removing the plating resist, by flash etching.

In another embodiment of the method of manufacturing a printed wiring board according to the present invention using the modified semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming a plating resist on the ultra-thin copper layer exposed by detaching the carrier, a step of applying light to the plating resist to remove the plating resist in the region in which a circuit is to be formed, a step of forming an electrolytic plating layer on the region in which the circuit is to be formed and the plating resist has been removed, a step of removing the plating resist; and a step of removing the non-electrolytic plating layer and the ultra-thin copper layer in the region except the region in which the circuit is to be formed, by e.g., flash etching.

In the present invention, the partly additive method refers to a method of manufacturing a printed-wiring board, which includes providing a catalyst nucleus on a substrate having a conductor layer and, if necessary, having holes for through-holes and via holes, forming a conductor circuit by etching, providing a solder resist or a plating resist, as needed, and thickening the conductor circuit, e.g., through-hole and via holes, by non-electrolytic plating.

Accordingly, in the embodiment of the method of manufacturing a printed wiring board according to the present invention using the partly additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and the insulating substrate, a step of applying a desmear treatment to the region containing the through-hole or/and blind vias, a step of providing a catalyst nucleus to the region containing the through-hole or/and blind vias, a step of providing an etching resist to the ultra-thin copper layer surface exposed by detaching the carrier, a step of forming a circuit pattern by applying light to the etching resist, a step of forming a circuit by removing the ultra-thin copper layer and the catalyst nucleus by e.g., an etching method using a corrosive solution such as an acid, or a plasma method, a step of removing the etching resist, a step of forming a solder resist or a plating resist on the surface of the insulating substrate exposed by removing the ultra-thin copper layer and the catalyst nucleus by e.g., an etching method using a corrosive solution such as an acid, or a plasma method; and a step of providing a non-electrolytic plating layer in the region in which neither the solder resist nor plating resist is provided.

In the present invention, the subtractive method refers to a method of forming a conductive pattern by selectively removing an unwanted part in the copper foil on a copper-clad laminate by e.g., etching.

Accordingly, in the embodiment of the method of manufacturing a printed wiring board according to the present invention using the subtractive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and insulating substrate, a step of applying a desmear treatment to the region containing the through-hole or/and blind vias, a step of providing an non-electrolytic plating layer in the region containing the through-hole or/and blind vias, a step of providing an electrolytic plating layer on the surface of the non-electrolytic plating layer, a step of providing an etching resist on the surface of the electrolytic plating layer or/and the ultra-thin copper layer, a step of forming a circuit pattern by applying light to the etching resist, a step of forming a circuit by removing the ultra-thin copper layer, non-electrolytic plating layer and electrolytic plating layer by e.g., an etching method using a corrosive solution such as an acid, or a plasma method; and a step of removing the etching resist.

In another embodiment of the method of manufacturing a printed wiring board according to the present invention using the subtractive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and insulating substrate a step of applying a desmear treatment to the region containing the through-hole or/and blind vias, a step of providing an non-electrolytic plating layer on the region containing the through-hole or/and blind vias, a step of forming a mask on the surface of the non-electrolytic plating layer, a step of forming an electrolytic plating layer on the surface of the non-electrolytic plating layer in which no mask is formed, a step of forming an etching resist on the surface of the electrolytic plating layer or/and the ultra-thin copper layer, a step of forming a circuit pattern by applying light to the etching resist, a step of forming a circuit by removing the ultra-thin copper layer and the non-electrolytic plating layer by e.g., an etching method using a corrosive solution such as an acid, or a plasma method; and a step of removing the etching resist.

The step of forming through-holes or/and blind vias and the following desmear step may not be performed.

Now, the method of manufacturing a printed wiring board using the carrier-attached copper foil of the invention will be more specifically described below, with reference to figures.

First, as shown in FIG. 1-A, a carrier-attached copper foil (first layer) having an ultra-thin copper layer having a roughened layer formed on the surface is prepared.

Next, as shown in FIG. 1-B, a resist is applied onto the roughened layer on the ultra-thin copper layer and subjected to a light exposure and development operation to etch the resist into a predetermined shape.

Next, as shown in FIG. 1-C, plating for a circuit is formed and thereafter the resist is removed to form a circuit plating having a predetermined shape.

Next, as shown in FIG. 2-D, an embedding resin is provided on the ultra-thin copper layer so as to cover the circuit plating (so as to bury the circuit plating) and subsequently another carrier-attached copper foil (second layer) is bonded from the side of the ultra-thin copper layer.

Next, as shown in FIG. 2-E, carrier is removed from the second layer carrier-attached copper foil.

Next, as shown in FIG. 2-F, holes are formed by applying laser at the predetermined positions of the resin layer and the circuit plating is exposed to light to form blind vias.

Next, as shown in FIG. 3-G, blind vias are embedded with copper to form via fill.

Next, as shown in FIG. 3-H, circuit plating is formed on the via fill, as FIG. 1-B and FIG. 1-C described above.

Next, as shown in FIG. 3-I, the carrier is removed from the firth carrier-attached copper foil.

Next, as shown in FIG. 4-J, the ultra-thin copper layer of both surfaces are removed by flash etching to expose the surface of the circuit plating within the resin layer.

Next, as shown in FIG. 4-K, bumps are formed on the circuit plating within the resin layer and a copper pillar is formed on the solder. In this manner, a printed-wiring board using the carrier-attached copper foil of the invention is prepared.

As the above another carrier-attached copper foil (second layer), the carrier-attached copper foil of the invention, a conventional carrier-attached copper foil or a general copper foil may be used. On the circuit on the second layer shown in FIG. 3-H, a single-layer circuit or plural-layer circuits may be formed. These circuits may be formed by any one of a semi-additive method, a subtractive method, a partly additive step and a modified semi-additive method.

Furthermore, the carrier-attached copper foil used as the first layer may have a substrate on a surface on the carrier side of the carrier-attached copper foil. The presence of the substrate or resin layer is advantageous since the carrier-attached copper foil used as the first layer is supported and wrinkle is rarely formed, with the result that productivity is improved. Note that as the substrate, any substrate may be used as long as it has an effect of supporting the carrier-attached copper foil used as the first layer. Example of the substrate that can be used herein include a carrier, a prepreg and a resin layer as described in the specification; a carrier, a prepreg, a resin layer, a metal plate, a metal foil, a plate of an inorganic compound, a foil of an inorganic compound, a board of an organic compound and a foil of an organic compound known in the art.

The timing at which the substrate is formed on the surface on the carrier side is not particularly limited, but it is necessary to form the substrate before the carrier is detached. In particular, it is preferred that the substrate is formed before the step of forming a resin layer on the surface on the ultra-thin copper layer side of the carrier-attached copper foil, and it is more preferred that the substrate is formed before the step of forming a circuit on the surface on the ultra-thin copper layer side of the carrier-attached copper foil.

In the carrier-attached copper foil according to the present invention, it is preferred that the color difference of the surface of the ultra-thin copper layer is controlled to satisfy the following (1). In the present invention, the "color difference of the ultra-thin copper layer surface" represents the color difference of the surface of the ultra-thin copper layer or if various surface treatments such as a roughening treatment has been applied, the color difference of the surface-treated layer surface. That is, in the carrier-attached copper foil according to the present invention, it is preferred that the color difference of the surface of the ultra-thin copper layer or the roughened layer or the heat-resistant layer or the rustproofing layer or the chromate treated layer or the layer treated with a silane coupling agent is controlled to satisfy the following (1) (1) The color difference ΔE*ab based on JIS Z8730 for the surface of the ultra-thin copper layer or the roughened layer or the heat-resistant layer or the rustproofing layer or the chromate treated layer or the layer treated with a silane coupling agent is 45 or more.

Color differences ΔL, Δa and Δb, each of which are measured by a color-difference meter, are general indexes represented by the L*a*b color system based on JIS Z8730 in consideration of further black/white/red/green/yellow/blue and ΔL represents black-white color difference, Δa red-green color difference and Δb Yellow Blue color difference. ΔE*ab is represented by the following expression using these color differences.

$$\Delta E^*ab = \sqrt{\Delta L^2 + \Delta a^2 + \Delta b^2}$$ [Expression 2]

The above-mentioned color difference can be adjusted by increasing the current density when forming the ultra-thin copper layer, reducing the copper concentration in the plating liquid, and increasing the linear flow rate of the plating liquid.

The above-mentioned color difference can also be adjusted by applying a roughening treatment to the surface of the ultra-thin copper layer to provide a roughened layer. If the roughened layer is provided, the color difference can be adjusted by using an electrolyte containing copper and one or more elements selected from the group consisting of nickel, cobalt, tungsten, and molybdenum, increasing the current density higher than conventionally (e.g., 40 to 60 A/dm$^2$), and shortening the processing time (e.g., 0.1 to 1.3 seconds). If a roughened layer is not provided on the surface of the ultra-thin copper layer, adjustment can be achieved by using a plating bath where the concentration of Ni is two times or more of other elements, processing Ni alloy plating (e.g., Ni—W alloy plating, Ni—Co—P alloy plating, Ni— Zn alloy plating) on the surface of the ultra-thin copper layer or the heat-resistant layer or the rustproofing layer or the chromate treated layer or the layer treated with a silane coupling agent with the current density set lower than conventionally (0.1 to 1.3 A/dm$^2$) and the processing time set longer than conventionally (20 seconds to 40 seconds).

If the color difference ΔE*ab based on JIS Z8730 for the ultra-thin copper layer surface is 45 or more, for example, when forming a circuit on the ultra-thin copper layer surface of the carrier-attached copper foil, contrast between the ultra-thin copper layer and the circuit becomes clear, resulting in good visibility, which enables precise alignment of the circuit. The color difference ΔE*ab based on JIS Z8730 for the ultra-thin copper layer surface is preferably 50 or more, more preferably 55 or more, and still more preferably 60 or more.

If the color difference of the surface of the ultra-thin copper layer or the roughened layer or the heat-resistant layer or the rustproofing layer or the chromate treated layer or the layer treated with a silane coupling agent is controlled as described above, the contrast with the circuit plating becomes clear, and the visibility becomes satisfactory. Accordingly, in a manufacturing step as illustrated in FIG. 3-C, for example, of the printed wiring board as described above, the circuit plating can be formed in a predetermined position with precision. According to the method of manufacturing the printed wiring board as described above, the circuit plating is configured to be embedded in the resin layer. Thus, when removing the ultra-thin copper layer by flash etching as illustrated in FIG. 4-J, for example, the circuit plating is protected by the resin layer, maintaining its geometry, thereby making it easy to form a fine circuit. Also, since the circuit plating is protected by the resin layer, migration resistance improves, and the electric connection between circuit wirings can be satisfactory suppressed. Thus, it becomes easy to form a fine circuit. As illustrated in FIGS. 4-J and 4-K, when the ultra-thin copper layer has been removed by flash etching, the exposed surface of the circuit plating is recessed within the resin layer. Thus, it becomes easy to form a bump on the circuit plating, and a copper pillar thereon, increasing the manufacturing efficiency.

Note that as the embedding resin (resin), a resin known in the art and a prepreg can be used. For example, BT (bis-maleimide triazine) resin and a prepreg, which is glass cloth impregnated with a BT resin, ABF film and ABF manufactured by Ajinomoto Fine-Techno Co., Inc. can be used. As the embedding resin (resin), the resin layer and/or resin and/or prepreg described in the specification can be used.

Examples

The present invention will be described below in more detail by Examples of the present invention. The present invention is not limited by these Examples.

1. Production of Carrier-Attached Copper Foil

The following copper foil bulk layers (raw foils) were prepared as Examples 1 to 10 and Comparative Examples 1 to 15.

General Electrolytic Raw Foil

A general electrolytic raw foil with a thickness of 18 μm (thickness by weight: 143 g/m$^2$) was fabricated using a copper sulfate electrolyte at a temperature of 57 to 62° C., with a copper concentration of 80 to 120 g/L, a sulfuric acid concentration of 80 to 120 g/L, a chloride ion concentration of 30 to 100 ppm, and a glue concentration of 1 to 5 ppm as an electrolytic copper plating bath, at the linear speed of the electrolyte flowing between an anode and a cathode (a metal drum for electrodepositing copper foils) of 1.5 to 2.5 m/s, and at the current density of 70 A/dm².

Carrier-Attached Copper Foil

A general electrolytic raw foil with a thickness of 18 μm was fabricated using the conditions for manufacturing a general electrolytic raw foil as described above. This was used as a copper foil carrier, and carrier-attached ultra-thin copper foils were obtained by forming intermediate layers, and ultra-thin copper layers having thicknesses of 1.5, 2, 3 and 5 μm according to the following method. Note that the remainder of the treatment liquid to be used in electrolytic, etching, surface treatment or plating (etchant, electrolyte) as described in the specification is water unless otherwise specified.

(1) Ni Layer (Intermediate Layer: Underlying Plating 1)

The S side of the copper foil carrier was electroplated on a roll-to-roll continuous plating line in the following conditions to form a Ni layer in an amount deposited of 1000 μg/dm². The plating conditions are more specifically as follows.

Nickel sulfate: 270 to 280 g/L

Nickel chloride: 35 to 45 g/L

Nickel acetate: 10 to 20 g/L

Boric acid: 30 to 40 g/L

Gloss agent: e.g., saccharin, butynediol

Sodium dodecyl sulfate: 55 to 75 ppm pH: 4 to 6

Bath temperature: 55 to 65° C.

Current density: 10 A/dm²

(2) Cr Layer (an Intermediate Layer: An Underlying Plating 2)

Next, the surface of the Ni layer formed in (1) was washed with water and an acid. Subsequently, on the Ni layer, a Cr layer (amount deposited: 11 g/dm²) was formed in accordance with an electrolytic chromate treatment on the roll-to-roll continuous plating line in the following conditions.

Potassium dichromate 1 to 10 g/L, zinc 0 g/L pH: 7 to 10

Liquid temperature: 40 to 60° C.

Current density: 2 A/dm²

(3) Ultra-Thin Copper Layer Next, the surface of the Cr layer formed in (2) was washed with water and an acid. Subsequently, on the Cr layer, an ultra-thin copper layer of 1.5, 2, 3 and 5 μm in thickness was formed in accordance with electrical plating on the roll-to-roll continuous plating line in the following conditions. In this manner, a carrier-attached ultra-thin copper foil was prepared.

Copper concentration: 80 to 120 g/L

Sulfuric acid concentration: 80 to 120 g/L

Chloride ion concentration: 30 to 100 ppm

Leveling agent 1 (bis(3-sulfopropyl)disulfide): 10 to 30 ppm

Leveling agent 2 (amine compound): 10 to 30 ppm Note that as the leveling agent 2, the following amine compound was used.

[Formula 1]

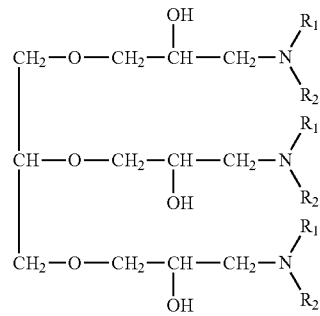

(where $R_1$ and $R_2$ each are selected from the group consisting of a hydroxyalkyl group, an ether group, an aryl group, an aromatic-substituted alkyl group, an unsaturated hydrocarbon group and an alkyl group)

Electrolyte temperature: 50 to 80° C.

Current density: 100 A/dm²

Next, surface treatments of roughening treatment, barrier treatment, rustproof treatment, and silane coupling agent application are applied in this order on the surface of the ultra-thin copper layer. The treatment conditions are as follows.

[Roughening Treatment]

Various roughening treatments were applied in the conditions described in Table 1 to the surfaces of the raw foils as mentioned above. In Table 1, a sample which has both descriptions of a roughening treatment 1 and a roughening treatment 2 indicates that the roughening treatment 1 and the roughening treatment 2 were conducted in this order.

Roughening treatment conditions (1) to (9) in Table 1 represent roughening treatment conditions described in Table 2 and 3.

[Barrier (Heat-Resistant) Treatment]

For Examples 1, 2, 4 to 7, and 10 and Comparative Examples 1, 3, 4, 8, 9, 13, and 14, barrier (heat-resistant) treatments were performed in the following conditions to form brass plating layers or zinc-nickel alloy plating layers.

Conditions for forming barrier layers (brass plating) for Examples 1, 4, 6, and 10 and Comparative Examples 1, 3, 8, and 13:

A brass plating bath was used at a copper concentration of 50 to 80 g/L, a zinc concentration of 2 to 10 g/L, a sodium hydroxide concentration of 50 to 80 g/L, a sodium cyanide concentration of 5 to 30 g/L, and a temperature of 60 to 90° C., a quantity of electricity for plating of 30 As/dm² was applied to the side where the roughened layer had been formed at a current density of 5 to 10 A/dm² (multi-stage treatment)

Conditions for forming barrier layers (zinc-nickel plating) for Examples 2, 5, and 7 and Comparative Examples 4, 9, and 14:

A plating bath was used where Ni: 10 g/L to 30 g/L, Zn: 1 g/L to 15 g/L, sulfuric acid ($H_2SO_4$): 1 g/L to 12 g/L, chloride ion: 0 g/L to 5 g/L were added, a quantity of electricity for plating of 5.5 As/dm² was applied to the side where the roughened layer had been formed at a current density of 1.3 A/dm².

[Rustproof Treatment]

For Examples 1, 2, 4 to 7, and 10 and Comparative Examples 1, 3, 4, 8, 9, 13, and 14, rustproof treatments (chromate treatments) were performed in the following conditions to form rustproofing layers.

(Chromate conditions) In a chromate bath at $CrO_3$: 2.5 g/L, Zn: 0.7 g/L, $Na_2SO_4$: 10 g/L, pH 4.8 and 54° C., a quantity of electricity of 0.7 As/dm² was applied.

[Silane Coupling Treatment]

For Examples 1, 2, 4 to 7, and 10 and Comparative Examples 1, 3, 4, 8, 9, 13, and 14, treatments with a silane coupling agent were performed in the following conditions to form layers treated with a silane coupling agent.

A silane coupling agent was applied by spraying an aqueous solution at pH 7 to 8 containing 0.2 to 2% alkoxy silanes onto the surface on the roughened side of the copper foil.

Note that for Example 10 and Comparative Example 1, after the rustproof treatment and the application of the silane coupling agent, a resin layer was further formed in the following conditions.

(Synthesis Example of Resin)

To a 2-L three-necked flask equipped with a stainless-steel anchor type stirrer, a nitrogen inlet tube and a reflux condenser in which an Allihn condenser was fitted on a trap with a stopcock, were added 117.68 g (400 mmol) of 3,4,3',4'-biphenyltetracarboxylic acid dianhydride, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (hereinafter referred to as NMP), 20 g of toluene, and the resulting mixture was heated at 180° C. for 1 hour, followed by cooling to around room temperature. Then, 29.42 g (100 mmol) of 3,4,3',4'-biphenyltetracarboxylic acid dianhydride, 82.12 g (200 mmol) of 2,2-bis{4-(4-aminophenoxy)phenyl}propane, 200 g of NMP, and 40 g of toluene were added to the mixture, which was mixed at room temperature for 1 hour, followed by heating at 180° C. for 3 hours to obtain a block copolymer polyimide with a solid content of 38%. In this block copolymer polyimide, the general formula (1): the general formula (2) as shown below=3:2, the number average molecular weight: 70000, and the weight average molecular weight: 150000.

The block copolymer polyimide solution obtained in the Synthesis Example was further diluted with NMP into a block copolymer polyimide solution with a solid content of 10%. To this block copolymer polyimide solution, was added bis(4-maleimidephenyl)methane (BMI-H, K.I Chemical Industry) such that the weight ratio thereof in the solid content was 35, and the weight ratio in the solid content of the block copolymer polyimide was 65 (i.e., the weight of bis(4-maleimidephenyl)methane solid content contained in the resin solution: the weight of block copolymer polyimide solid content contained in the resin solution=35:65). The resultant was solution-mixed at 60° C. for 20 minutes to obtain a resin solution. Subsequently, the resin solution was coated by a reverse roll coater on the M side (glossy side) of the copper foil in Example 28, and on the ultra-thin copper surface of the copper foil in Example 8, followed by drying treatment at 120° C. for 3 minutes, 160° C. for 3 minutes under nitrogen atmosphere. Finally, heating treatment at 300° C. for 2 minutes was performed to fabricate a copper foil with a resin layer. The thickness of the resin layer was 2 μm.

The obtained carrier-attached copper foil having a resin layer was bonded to both surfaces of a BT (bismaleimide-triazine) resin with a thickness of 100 μm manufactured by Mitsubishi Gas Chemical Company, Inc. from the resin layer side. The carrier was detached from the carrier-attached copper foil to fabricate a double-sided copper-clad laminate. Subsequently, the side of exposed ultra-thin copper layer surface was irradiated with a pulse laser to form a through hole. As a result, the number of pulses (number of shots) of the laser required to form a through hole is smaller in the double-sided copper-clad laminate fabricated by using the carrier-attached copper foil of Example 10 than in the double-sided copper-clad laminate fabricated by using the carrier-attached copper foil of Comparative Example 1. Therefore, it is believed that the double-sided copper-clad laminate fabricated by using the carrier-attached copper foil of Example 10 is more productive.

2. Evaluation of Carrier-Attached Copper Foil

The carrier-attached copper foils obtained as described above were evaluated by the following methods.

<Surface Roughness of Ultra-Thin Copper Layer>

The surface roughness Rz (laser) of the ultra-thin copper layer was measured in accordance with JIS B0601-1994 on a laser microscope OLS4000 manufactured by Olympus

[Formula 2]

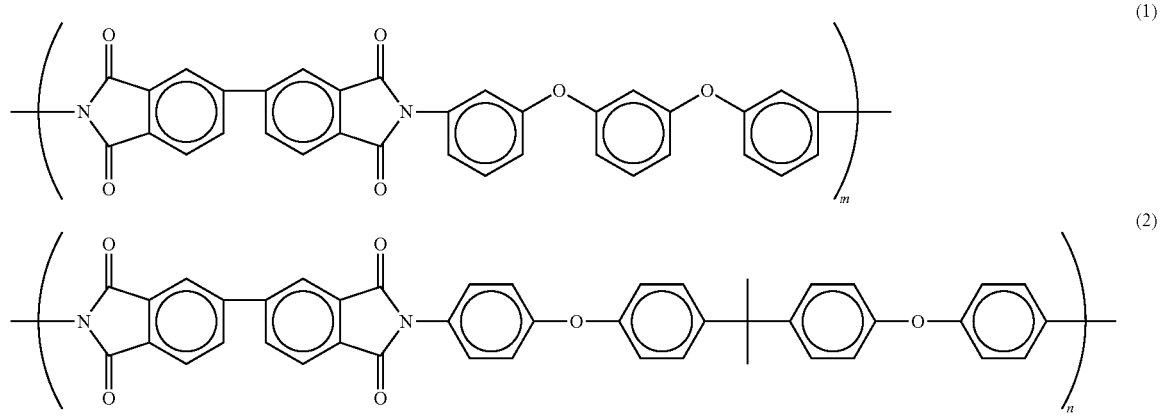

Corporation. Rz (laser) was measured at arbitrary 10 points, the average value of the Rz (laser) at 10 points was the value of Rz (laser).

Note that, each value for Rz was obtained in conditions where the evaluated length is 647 μm, and the cutoff value is zero in observation with 1000 times magnification of the surfaces of the ultra-thin copper layer and the carrier as measured in the transvers direction (TD) with respect to the traveling direction of the electrolytic copper foil in the manufacturing apparatus of the electrolytic copper foil used as the carrier. The environment temperature when Rz of the surface was measured by the laser microscope was set at 23 to 25° C.

<Migration>

DF (dry film, made by Hitachi Chemical Co., Ltd., trade name RY-3625) was laminated and applied on the ultra-thin copper layer surface of each of the carrier-attached copper foils (for Example 10 and Comparative Example 1, the carrier-attached copper foils before the resin layers were formed) (a square of 550 mm×550 mm). The resultant was exposed to light in the condition of 15 mJ/cm$^2$, subject to solution jet agitation using a developer (sodium carbonate) at 38° C. for 1 min, forming a resist pattern with a line-and-space (L/S)=7.5 μm/7.5 μm. Then, copper sulfate plating (CUBRITE21 made by Ebara-Udylite) was used to plate up for 7.5 μm, DF was released with a release liquid (sodium hydroxide), and copper plating wiring with a line-and-space (L/S)=7.5 μm/7.5 μm was formed per area with a size of 55 mm×55 mm on the ultra-thin copper layer surface. Subsequently, a resin (BT (bismaleimide-triazine) resin) was laminated on the ultra-thin copper layer surface so that the formed copper plating wiring was embedded, an electrolytic copper foil JTC foil (thickness: 18 μm) made by JX Nippon Mining & Metals Corporation was further laminated from the glossy surface side on the resin. Subsequently, under pressure, the resultant was heated at 220° C. for 2 hours to fabricate a laminate of the carrier-attached copper foil, resin and electrolytic copper foil. Subsequently, the carrier of the carrier-attached copper foil was removed from the laminate, then the exposed ultra-thin copper layer was etched off with a sulfuric acid-hydrogen peroxide etchant to form a wiring with L/S=7.5 μm/7.5 μm. Out of the obtained wiring board, 100 wiring boards were cut out according to areas with a size of 55 mm×55 mm as mentioned above.

With respect to the obtained wiring boards, the presence of insulation degradation between wiring patterns was evaluated in the following measurement conditions using a migration measurement machine (MIG-9000 made by IMV). The number of substrates in which the migration had occurred was evaluated for 100 wiring boards to calculate the short circuit (migration) occurrence rate [=(Number of Migration Occurrence/100)×100](%).

Measurement Conditions
Threshold: initial resistance 60% down
Measurement time: 1000 h
Voltage: 60 V
Temperature: 85° C.
Relative humidity: 85% RH <Light Absorbance of Light>

The light absorbance was measured as follows.

The total reflection of light at a wavelength of 400 nm at the ultra-thin copper layer surface of each of the carrier-attached copper foils was measured, and the absorbance of light at a wavelength of 400 nm was measured following the Expression below. Note that the reason why the light absorbance is measured by the light at a wavelength of 400 nm in the present invention is because the wavelength of light used for exposing to light a dry film to be a copper plating resist when forming a copper plating circuit is around 400 nm in most cases.

[Absorbance of light at wavelength of 400 nm](*)=100(%)−[Total reflectivity of light at wavelength of 400 nm](%)

Here, the measurement for the total reflectivity of light was performed on 200 nm to 2600 nm, and the measurement value of the total reflectivity of light when the wavelength is 400 nm was adopted.

Note that the above measurement of the total reflectivity of light was performed at a total of 3 points including each 1 point within the areas within 50 mm from both ends, in the length direction of a sample sheet of each of the carrier-attached copper foils, and 1 point within the area of 50 mm×50 mm at the center. The 3 measurement points are shown in FIG. 5.

The arithmetic average value of the values of the total reflectivity of light at a wavelength of 400 nm measured at the 3 points was the total reflectivity of light at a wavelength of 400 nm of the sample sheet. Note that if the size of sample is small, the areas within 50 mm from the both ends and the area of 50 mm×50 mm at the center described above may overlap with each other.

<Measurement Apparatus>

U-4100 (made by Hitachi, Ltd., a UV-Vis-NIR spectrophotometer (solid))

<Measurement Conditions>

Measurement method: total reflection method (reference: aluminum oxide standard white plate)
Mode: total reflection
Measurement mode: wavelength scanning
Data mode: % R
Initial measurement wavelength: 2600.00 nm
Final measurement wavelength: 200.00 nm
Sampling interval: 1.00 nm
Incident angle: set as recommended by the above measurement apparatus (10°)
Detector: integrating sphere/photomultiplier tube (200 nm to 850 nm)
: integrating sphere/PbS (850 nm to 2600 nm)
Detector switching wavelength: 850 nm
Photomultiplier voltage: Automatic 1
Light-source switching mode: automatic switching
Light-source switching wavelength: 340.00 nm
Baseline settings: set as recommended by the above measurement apparatus.
High-resolution measurement: OFF
Attenuation rate of light-attenuation plate: a light-attenuation plate was not used
Cell length: 10.0 mm
Ultraviolet-Visible Region (Wavelength: 200 nm to 850 nm)
Scanning speed: 300 nm/min
Slit width: 6.00 nm (fixed)
Near-Infrared Region (Wavelength: 850 nm to 2600 nm)
Scanning speed: 750 nm/min
Slit width: automatically controlled
PbS sensitivity: 2
Correction for detector switching: no correction
Light intensity control mode: constant <Circuit Formability (Circuit Dropout Rate)>

DF (dry film, made by Hitachi Chemical Co., Ltd., trade name RY-3625) was laminated and applied on the ultra-thin copper layer surface of each of the carrier-attached copper foils (for Example 10 and Comparative Example 1, the carrier-attached copper foils before the resin layers were formed) (a square of 550 mm×550 mm). The resultant was exposed to light in the condition of 15 mJ/cm$^2$, subject to solution jet agitation using a developer (sodium carbonate) at 38° C. for 1 min, forming a resist pattern with a line-and-space (L/S)=7.5 μm/7.5 μm. Then, copper sulfate plating (CUBRITE21 made by Ebara-Udylite) was used to plate up for 7.5 μm, DF was released with a release liquid (sodium hydroxide), and copper plating wiring with a line-and-space (L/S)=7.5 μm/7.5 μm was formed per area with a size of 55 mm×55 mm on the ultra-thin copper layer surface. Then, 100 samples were cut out according to areas with a size of 55 mm×55 mm as mentioned above. AOI inspections were performed on the obtained samples, and the number of samples with dropout copper plating wiring was measured.

The circuit dropout rate was evaluated using the following expression.

Circuit dropout rate (%)=Number of samples with dropout copper plating wiring(sheets)/100 (sheets)×100(%)

The testing conditions and evaluation results are shown in Tables 1 to 3.

TABLE 1

| Sample | Roughening treatment 1 | | | | Roughening treatment 2 | | | | | | |
|---|---|---|---|---|---|---|---|---|---|---|---|
| | Roughening treatment 1 Condition | Roughening treatment 1 Current density (A/dm$^2$) | Roughening treatment 1 Time (s) | Roughening treatment 1 Quantity of coulomb (As/dm$^2$) | Roughening treatment 2 Condition | Roughening treatment 2 Current density (A/dm$^2$) | Roughening treatment 2 Time (s) | Roughening treatment 2 Quantity of coulomb (As/dm$^2$) | Absorbance of light at a wavelength of 400 nm (%) | Roughness by laser (Rz JIS. μm) | Short circuit (migration) occurrence rate (%) | Circuit dropout rate (%) |
| Example 1 | (1) | 40 | 0.75 | 30 | (2) | 28 | 8.00 | 224 | 95.6 | 1.44 | 9 | 3 |
| Example 2 | (1) | 40 | 0.75 | 30 | (2) | 28 | 6.00 | 168 | 93.4 | 1.42 | 9 | 6 |
| Example 3 | (1) | 40 | 0.75 | 30 | (2) | 55 | 1.50 | 82.5 | 92.5 | 1.38 | 7 | 8 |
| Example 4 | (3) | 50 | 15.00 | 750 | (4) | 25 | 8.00 | 200 | 91.8 | 1.68 | 20 | 18 |
| Example 5 | (6) | | | | (7) | | | | 92.7 | 1.75 | 21 | 15 |
| Example 6 | (5) | 40 | 2 | 80 | — | — | — | — | 93.2 | 1.26 | 4 | 6 |
| Example 7 | (5) | 30 | 10 | 300 | — | — | — | — | 95.5 | 1.28 | 4 | 3 |
| Example 8 | (5) | 45 | 1 | 45 | — | — | — | — | 92.4 | 1.22 | 3 | 8 |
| Example 9 | (5) | 35 | 15 | 525 | — | — | — | — | 99.1 | 1.31 | 5 | 1 |
| Example 10 | (8) | 50 | 13 | 650 | (9) | 25 | 8.00 | 200 | 85.2 | 2.48 | 22 | 25 |
| Comparative Example 1 | (3) | 110 | 5.00 | 550 | (4) | 25 | 8.00 | 200 | 82.8 | 3.00 | Short circuit in all samples | 28 |
| Comparative Example 2 | — | — | — | — | — | — | — | — | 37.0 | 1.08 | — | Dropout in all samples |
| Comparative Example 3 | (1) | 20 | 0.20 | 4 | (2) | 28 | 1.43 | 40 | 78.0 | 1.21 | 3 | 32 |
| Comparative Example 4 | (1) | 40 | 0.75 | 30 | (2) | 28 | 1.43 | 40 | 78.2 | 1.23 | 3 | 32 |
| Comparative Example 5 | (1) | 58 | 1.40 | 81 | (2) | 28 | 1.43 | 40 | 79.0 | 1.25 | 1 | 34 |
| Comparative Example 6 | (1) | 40 | 0.75 | 30 | (2) | 24 | 2.00 | 48 | 77.9 | 1.20 | 3 | 35 |
| Comparative Example 7 | (1) | 40 | 0.75 | 30 | (2) | 50 | 0.68 | 34 | 82.1 | 1.40 | 8 | 28 |
| Comparative Example 8 | (3) | 25 | 20.00 | 500 | (4) | 25 | 8.00 | 200 | 78.1 | 1.68 | 20 | 35 |
| Comparative Example 9 | (3) | 50 | 5.00 | 250 | (4) | 25 | 8.00 | 200 | 77.3 | 1.71 | 21 | 35 |
| Comparative Example 10 | (3) | 110 | 0.45 | 50 | (4) | 25 | 8.00 | 200 | 79.2 | 1.73 | 21 | 34 |
| Comparative Example 11 | (3) | 50 | 5.00 | 250 | (4) | 5 | 60.00 | 300 | 78.3 | 1.71 | 21 | 32 |
| Comparative Example 12 | (3) | 50 | 5.00 | 250 | (4) | 50 | 1.00 | 50 | 76.1 | 1.65 | 20 | 42 |
| Comparative Example 13 | (5) | 20 | 1.00 | 20 | — | — | | | | | | |
| Comparative Example 14 | (5) | 25 | 3.00 | 75 | — | — | | | | | | |
| Comparative Example 15 | (5) | 30 | 5.00 | 150 | — | — | | | | | | |

TABLE 1-continued

| | | | | | |
|---|---|---|---|---|---|
| Comparative Example 13 | — | — | 80.9 | 1.19 | 3 | 30 |
| Comparative Example 14 | — | — | 81.1 | 1.20 | 3 | 29 |
| Comparative Example 15 | — | — | 82.2 | 1.21 | 3 | 28 |

TABLE 2

| Roughening treatment condition | | | | |
|---|---|---|---|---|
| (1) | (2) | (3) | (4) | (5) |
| (Liquid composition) Cu: 10-20 g/L H$_2$SO$_4$: 50-100 g/L (Electroplating condition) Liquid temperature: 25-50° C. | (Liquid composition) Cu: 10-20 g/L Ni: 5-15 g/L Co: 5-15 g/L (Electroplating condition) pH: 2-3 Liquid temperature: 30-50° C. | (Liquid composition) Cu: 10-30 g/L H$_2$SO$_4$: 10-150 g/L W: 0.1-50 mg/L Sodium dodecyl sulfate: 1-50 mg/L As: 2-200 mg/L (Electroplating condition) Temperature: 30-70° C. | (Liquid composition) Cu: 20-80 g/L H$_2$SO$_4$: 50-200 g/L (Electroplating condition) Temperature: 30-70° C. | (Liquid composition) Cu: 10-20 g/L Co: 1-10 g/L Ni: 1-10 g/L (Electroplating condition) pH: 1-4 Liquid temperature: 40-50° C. |

TABLE 3

| Roughening treatment condition | | | |
|---|---|---|---|
| (6) | (7) | (8) | (9) |
| (Liquid composition) Cu concentration: 10-20 g/L H$_2$SO$_4$ concentration: 80-120 g/L Tungsten concentration: 1-10 mg/L (added as sodium tungstate dihydrate) Sodium dodecyl sulfate concentration: 1-10 mg/L (Electrolyte temperature) 35-45° C. (Current condition) Two stages were applied. The current density was as follows. First-stage: 50 A/dm$^2$ 1 second quantity of coulomb 50 As/dm$^2$ Second-stage: 10 A/dm$^2$ 10 seconds quantity of coulomb 100 As/dm$^2$ | (Liquid composition) Cu: 40-50 g/L H$_2$SO$_4$: 80-120 g/L (Electrolyte temperature) 43-47° C. (Current condition) Current density: 41 A/dm$^2$ Time: 10 seconds Quantity of coulomb 410 As/dm$^2$ | (Liquid composition) Cu: 10-30 g/L H$_2$SO$_4$: 10-150 g/L As: 0.1-200 mg/L (Electroplating condition) Temperature: 30-70° C. | (Liquid composition) Cu: 20-80 g/L H$_2$SO$_4$: 50-200 g/L (Electroplating condition) Temperature: 30-70° C. |

(Evaluation Results)

In each of Examples 1 to 10, the absorbance of light at a wavelength of 400 nm of the ultra-thin copper layer surface was 85% or more, thus the circuit formability was satisfactory.

In each of Comparative Examples 1 to 15, the absorbance of light at a wavelength of 400 nm of the ultra-thin copper layer surface was less than 85%, thus the circuit formability was unsatisfactory.

REFERENCE SIGNS LIST 10, 20, 30, 40, 50 Laminate
11, 21, 31, 41, 51 Carrier-attached copper foil
12, 22, 32, 42, 52 Carrier
13, 23, 33, 43, 53 Intermediate layer
14, 24, 34, 44, 54 Ultra-thin copper layer
15, 25, 35, 45, 55 Resin
16, 26, 36, 46, 56 Prepreg
17, 27, 47 Aperture
18, 28, 38, 48, 58 Resin plate
19, 29, 39, 49, 59 Prepreg plate

The invention claimed is:

1. A carrier-attached copper foil having a carrier, an intermediate layer and an ultra-thin copper layer in this order,
wherein a surface of the ultra-thin copper layer has an absorbance of light at a wavelength of 400 nm of 85% or more,
wherein the surface of the ultra-thin copper layer has an absorbance of light at a wavelength of 400 nm of 87% or more,
wherein an average value of surface roughness Rz of the surface of the ultra-thin copper layer is 1.7 μm or less, as measured by a laser microscope in accordance with JIS B0601-1994, and
the ultra-thin copper layer can be detached from the carrier by peeling.

2. The carrier-attached copper foil according to claim 1, wherein the surface of the ultra-thin copper layer has an absorbance of light at a wavelength of 400 nm of 90% or more.

3. The carrier-attached copper foil according to claim 2, wherein the surface of the ultra-thin copper layer has an absorbance of light at a wavelength of 400 nm of 91% or more.

4. The carrier-attached copper foil according to claim 3, wherein the surface of the ultra-thin copper layer has an absorbance of light at a wavelength of 400 nm of 92% or more.

5. The carrier-attached copper foil according to claim 4, wherein the surface of the ultra-thin copper layer has an absorbance of light at a wavelength of 400 nm of 93% or more.

6. The carrier-attached copper foil according to claim 5, wherein the surface of the ultra-thin copper layer has an absorbance of light at a wavelength of 400 nm of 95% or more.

7. The carrier-attached copper foil according to claim 1, having a roughened layer on at least one surface or both surfaces of the ultra-thin copper layer and the carrier.

8. The carrier-attached copper foil according to claim 7, wherein the roughened layer is a layer formed of an element selected from the group consisting of copper, nickel, cobalt, phosphorus, tungsten, arsenic, molybdenum, chromium and zinc or an alloy containing at least one of these.

9. The carrier-attached copper foil according to claim 7, comprising a resin layer on a surface of the roughened layer.

10. The carrier-attached copper foil according to claim 7, having at least one layer selected from the group consisting of a heat-resistant layer, a rustproofing layer, a chromate-treated layer and a layer treated with a silane coupling agent on a surface of the roughened layer.

11. The carrier-attached copper foil according to claim 10, comprising a resin layer on the at least one layer selected from the group consisting of a heat-resistant layer, a rust-proofing layer, a chromate-treated layer and a layer treated with a silane coupling agent.

12. The carrier-attached copper foil according to claim 1, having at least one layer selected from the group consisting of a heat-resistant layer, a rustproofing layer, a chromate-treated layer and a layer treated with a silane coupling agent on at least one surface or both surfaces of the ultra-thin copper layer and the carrier.

13. The carrier-attached copper foil according to claim 12, comprising a resin layer on the at least one layer selected from the group consisting of a heat-resistant layer, a rust-proofing layer, a chromate-treated layer and a layer treated with a silane coupling agent.

14. The carrier-attached copper foil according to claim 1, comprising a resin layer on the ultra-thin copper layer.

15. A method comprising manufacturing a copper-clad laminate by using the carrier-attached copper foil according to claim 1.

16. A method comprising manufacturing a printed wiring board by using the carrier-attached copper foil according to claim 1.

17. A method for manufacturing a printed wiring board, comprising:
   a step of preparing the carrier-attached copper foil according to claim 1 and an insulating substrate being dry film, resist or photo-curable resin,
   a step of laminating the carrier-attached copper foil and the insulating substrate,
   a step of forming a copper-clad laminate by detaching the carrier from the carrier-attached copper foil after the carrier-attached copper foil and the insulating substrate are laminated, and thereafter,
   a step of forming a circuit by any one of a semi-additive method, a subtractive method, a partly-additive method or a modified semi-additive method,
   wherein the circuit is formed by using a light exposure operation and a development operation to the dry film, the resist or the photo-curable resin.

18. A method for manufacturing a printed wiring board, comprising:
   a step of forming a circuit on the surface of the ultra-thin copper layer of the carrier-attached copper foil according to claim 1 by providing a resist on the surface of the ultra-thin copper layer and conducting a light exposure operation and a development operation to the resist,
   a step of forming a resin layer on the surface of the ultra-thin copper layer of the carrier-attached metal foil so as to bury the circuit,
   a step of forming a circuit on the resin layer,
   a step of detaching the carrier after the circuit is formed on the resin layer, and
   a step of exposing the circuit buried in the resin layer and formed on the surface of the ultra-thin copper layer by removing the ultra-thin copper layer after the carrier is detached.

19. The method for manufacturing a printed wiring board according to claim 18, wherein the step of forming a circuit on the resin layer is a step of bonding another carrier-attached copper foil to the resin layer from the side of the ultra-thin copper layer and forming the circuit using the carrier-attached copper foil bonded to the resin layer.

20. The method for manufacturing a printed wiring board according to claim 18, further comprising a step of forming a substrate on the surface of the carrier of the carrier-attached copper foil before detaching the carrier.

21. A copper-clad laminate comprising the carrier-attached copper foil according to claim 1.

* * * * *